United States Patent
Odan et al.

(10) Patent No.: US 6,614,250 B1
(45) Date of Patent: Sep. 2, 2003

(54) SENSOR PROBE FOR USE IN BOARD INSPECTION AND MANUFACTURING METHOD THEREOF

(75) Inventors: Yuji Odan, Hiroshima (JP); Shuji Yamaoka, Hiroshima (JP)

(73) Assignee: OHT Inc., Hiroshima (JP)

( * ) Notice: Subject to any disclaimer, the term of this patent is extended or adjusted under 35 U.S.C. 154(b) by 0 days.

(21) Appl. No.: 09/572,254

(22) Filed: May 17, 2000

(51) Int. Cl.⁷ .......................... G01R 31/26; G01R 31/02
(52) U.S. Cl. ........................................ 324/765; 324/755
(58) Field of Search ................................ 324/765, 754, 324/755, 538, 158.1

(56) References Cited

U.S. PATENT DOCUMENTS

| | | | |
|---|---|---|---|
| 5,177,438 A | * 1/1993 | Littlebury et al. | ........... 324/765 |
| 5,254,953 A | * 10/1993 | Crook et al. | ................. 324/538 |
| 5,517,110 A | * 5/1996 | Soiferman | ................... 324/538 |
| 5,574,382 A | * 11/1996 | Kimura | ....................... 324/754 |
| 5,672,978 A | * 9/1997 | Kimura | ....................... 324/754 |
| 5,977,783 A | * 11/1999 | Takayama et al. | ........... 324/754 |
| 6,147,311 A | * 11/2000 | Higashi | ........................ 439/91 |
| 6,201,398 B1 | * 3/2001 | Takada | ........................ 324/537 |

FOREIGN PATENT DOCUMENTS

| JP | 58216967 A | * 12/1983 | ............... 324/158.1 |
|---|---|---|---|
| JP | 8-278342 | 10/1996 | |
| JP | 9-264919 | 10/1997 | |
| JP | 2000-55991 | 2/2000 | |

* cited by examiner

Primary Examiner—Kamand Cuneo
Assistant Examiner—Jermele Hollington
(74) Attorney, Agent, or Firm—Armstrong, Westerman, & Hattori, LLP.

(57) ABSTRACT

The present invention provides an apparatus and a method for used in a board inspection capable of an inspection of defect in a circuit board with high resolution over a wide range. The method is used for manufacturing a sensor probe comprising layers which include an electrode layer, a lead wire layer and a bridge layer (41). These layers are laminated on a base (30) in the form of a flat plate composed of silicon. The electrode layer is comprised of a set of sensor electrodes (40). The lead wire layer is comprised of a set of lead wires (50) for transferring a signal externally. The bridge layer couples between the electrode layer and the lead wire layer. The lead wire layer is formed by means of depositing aluminum in accordance with a first mask pattern. The bridge layer is formed by means of growing each of bridge wires (41) in the direction perpendicular to the base. The bridge wires extend in the direction perpendicular to the base and are connected to respective lead wires of the lead layer. The respective electrodes of the electrode layer are formed by depositing aluminum in accordance with a second mask pattern. The plurality of sensor electrodes respectively extend in the horizontal direction and having a predetermined area. A shield layer (33) is provided between the electrode layer (40) and the lead wire layer (50).

11 Claims, 26 Drawing Sheets

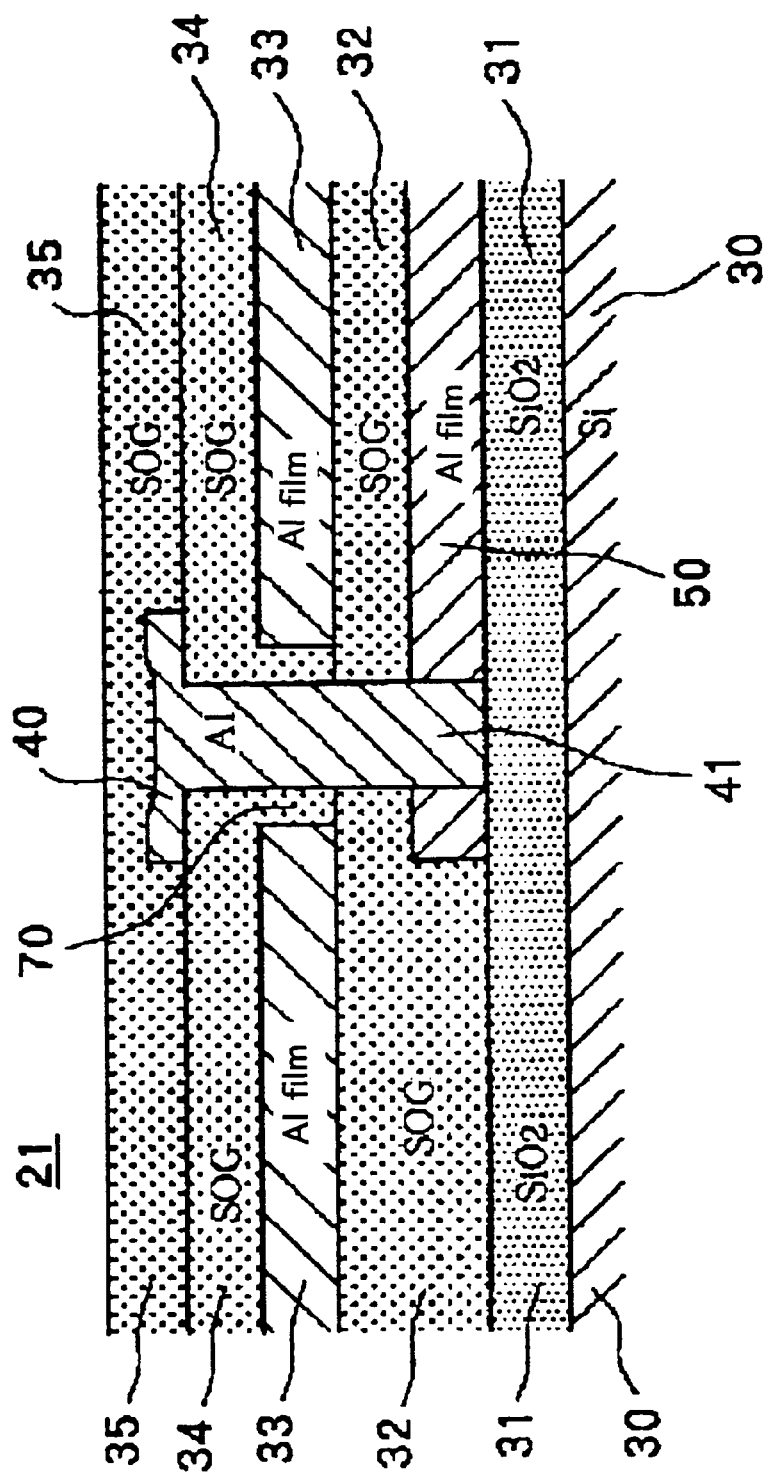
F I G. 6

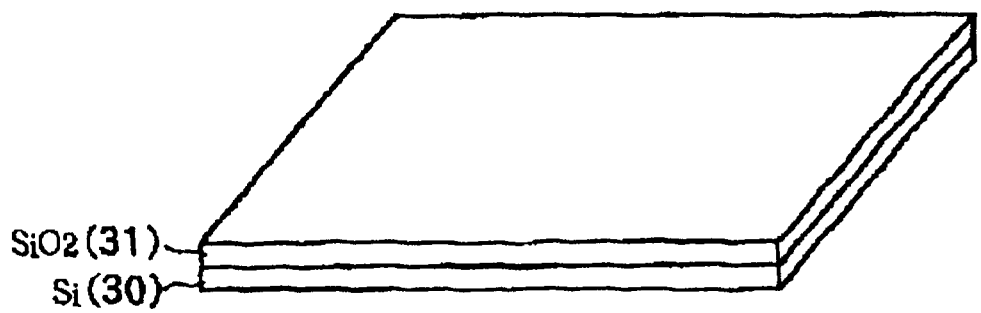
F I G. 8
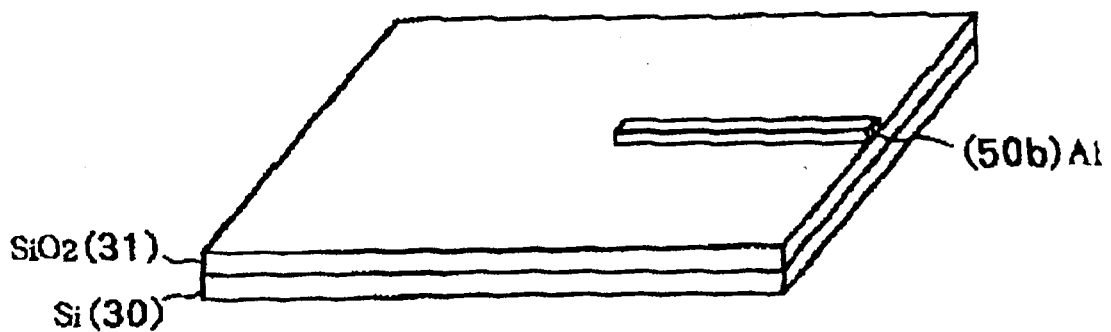
F I G. 9

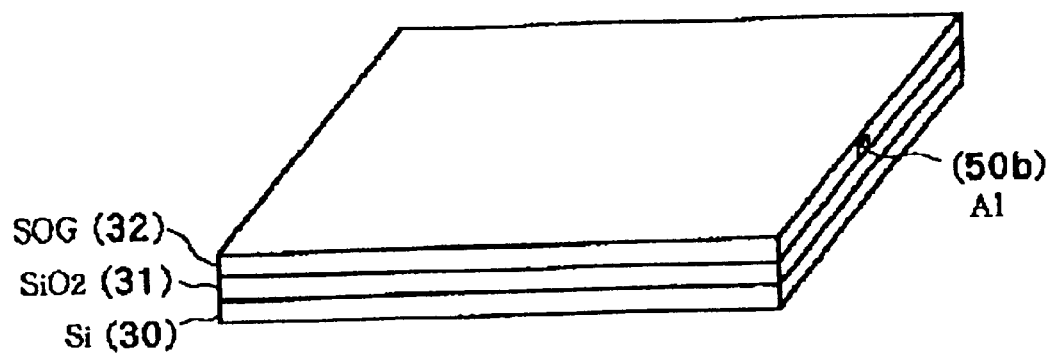
F I G. 10
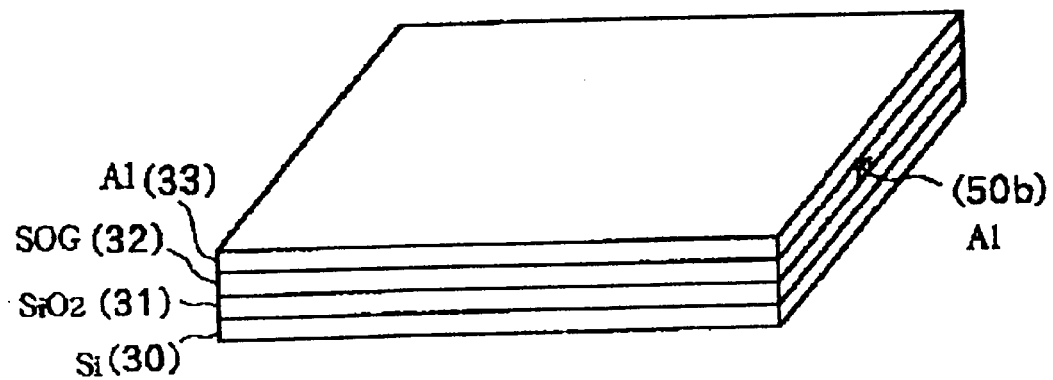
F I G. 11

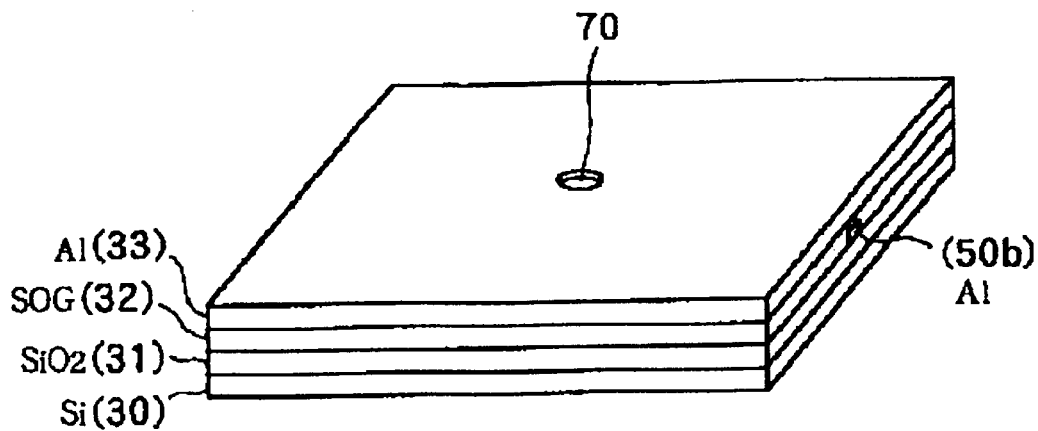
F I G. 1 2
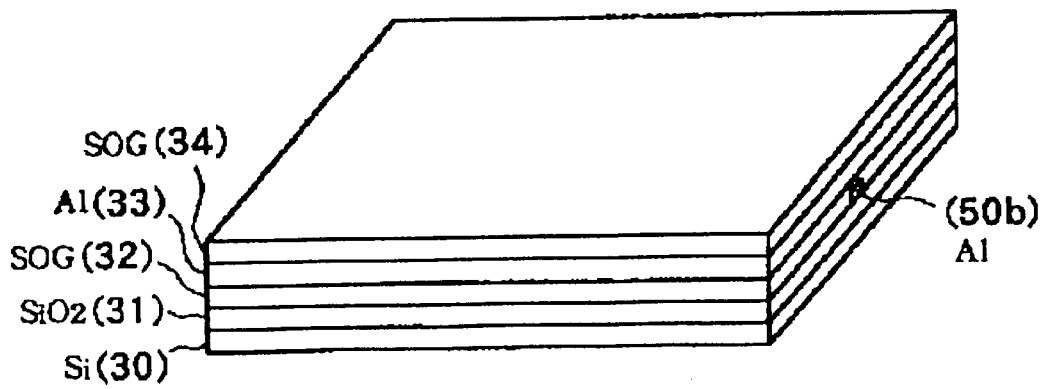
F I G. 1 3

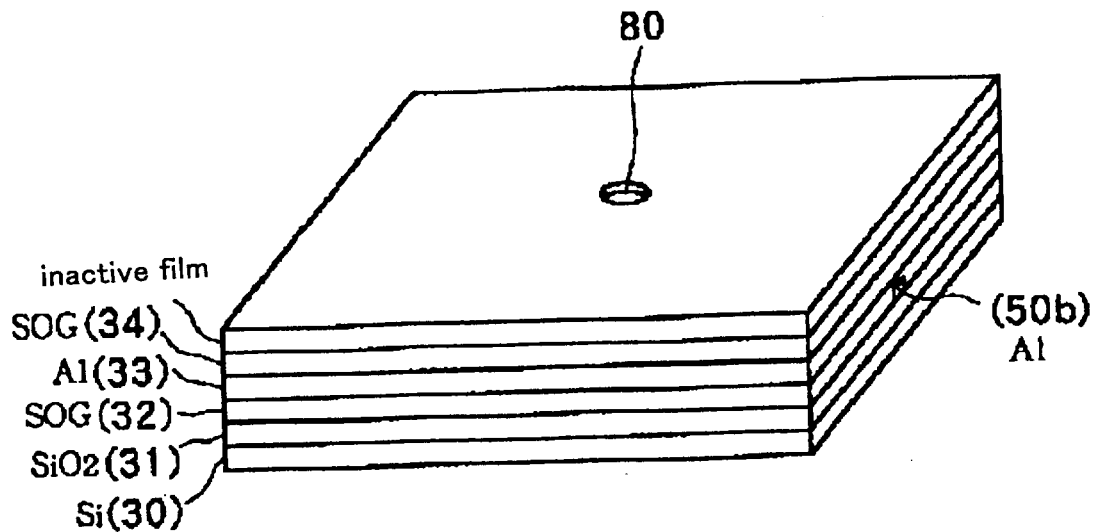
F I G. 1 4
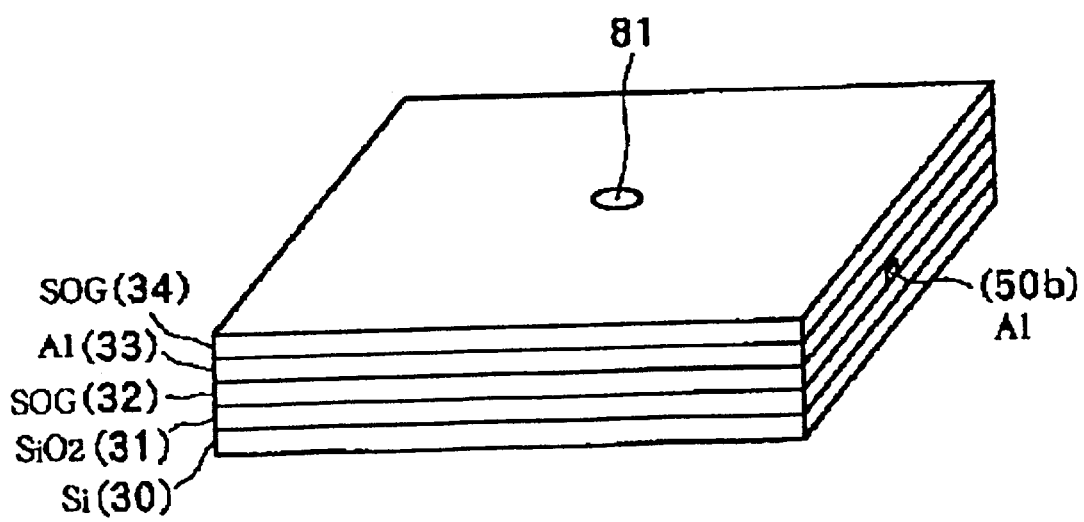
F I G. 1 5

| 10 (1,1) | 10 (1,2) | 10 (1,3) | 10 (1,4) | 0 (1,5) | 0 (1,1) |
|---|---|---|---|---|---|
| 95 (2,1) | 95 (2,2) | 85 (2,3) | 90 (2,4) | 0 (2,5) | 0 (2,1) |
| 100 (3,1) | 100 (3,2) | 100 (3,3) | 100 (3,4) | 15 (3,5) | 0 (3,6) |
| 100 (4,1) | 100 (4,2) | 100 (4,3) | 100 (4,4) | 99 (4,5) | 10 (4,6) |
| 100 (5,1) | 100 (5,2) | 100 (5,3) | 100 (5,4) | 100 (5,5) | 90 (5,6) |
| 10 (6,1) | 10 (6,2) | 90 (6,3) | 100 (6,4) | 100 (6,5) | 100 (6,6) |
| 0 (7,1) | 0 (7,2) | 10 (7,3) | 95 (7,4) | 100 (7,5) | 100 (7,6) |

FIG. 21

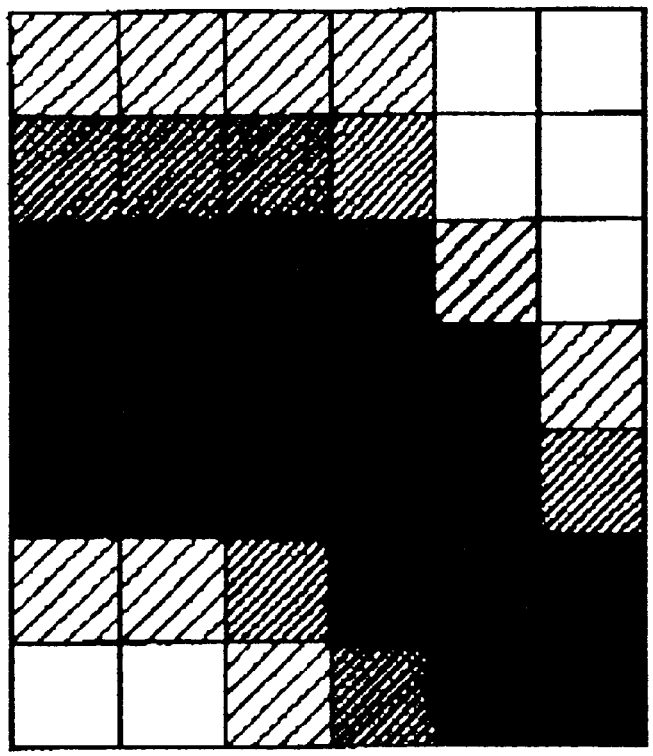
probe reference number : XX
pattern reference number : YY
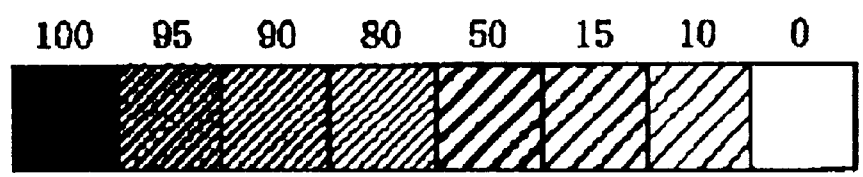
FIG. 22

| 10 (1,1) | 10 (1,2) | 10 (1,3) | 0 (1,4) | 0 (1,5) | 0 (1,1) |
|---|---|---|---|---|---|
| 95 (2,1) | 95 (2,2) | 85 (2,3) | 5 (2,4) | 0 (2,5) | 0 (2,1) |
| 100 (3,1) | 100 (3,2) | 100 (3,3) | 10 (3,4) | 0 (3,5) | 0 (3,6) |
| 100 (4,1) | 100 (4,2) | 95 (4,3) | 5 (4,4) | 70 (4,5) | 10 (4,6) |
| 99 (5,1) | 99 (5,2) | 50 (5,3) | 90 (5,4) | 100 (5,5) | 80 (5,6) |
| 10 (6,1) | 10 (6,2) | 80 (6,3) | 100 (6,4) | 100 (6,5) | 95 (6,6) |
| 0 (7,1) | 0 (7,2) | 10 (7,3) | 100 (7,4) | 100 (7,5) | 100 (7,6) |

F I G. 2 4

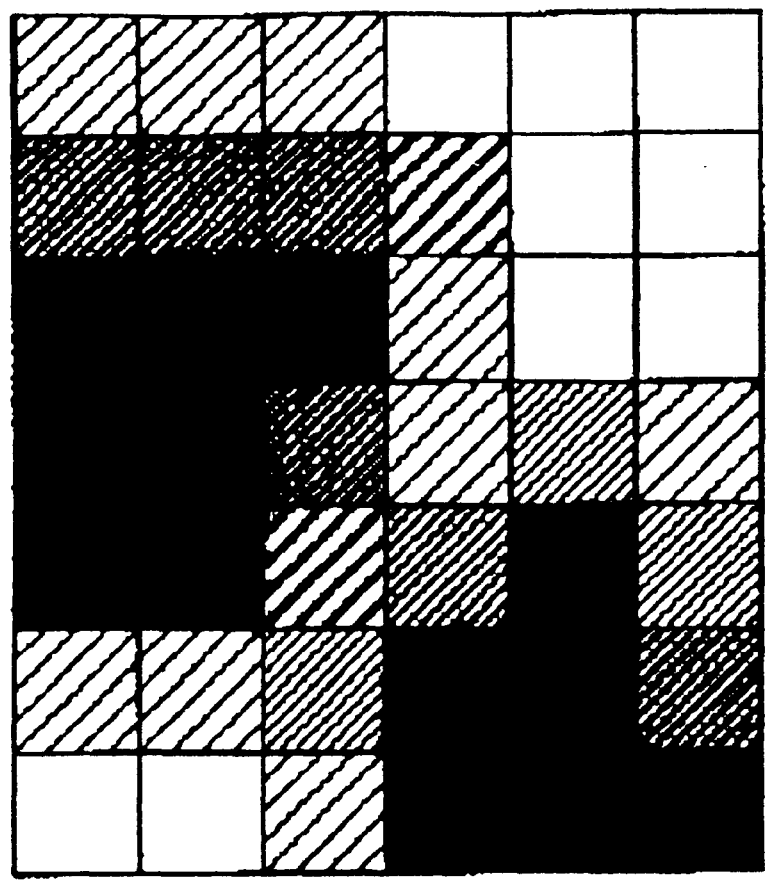
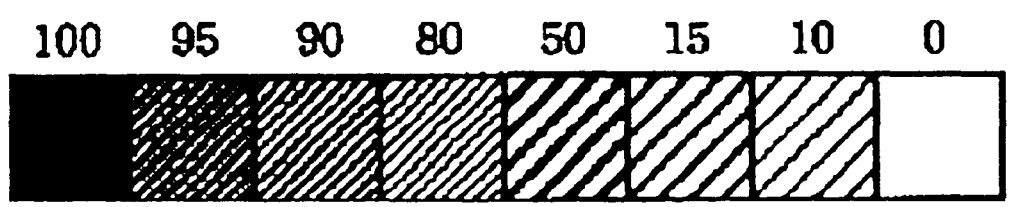
FIG. 25

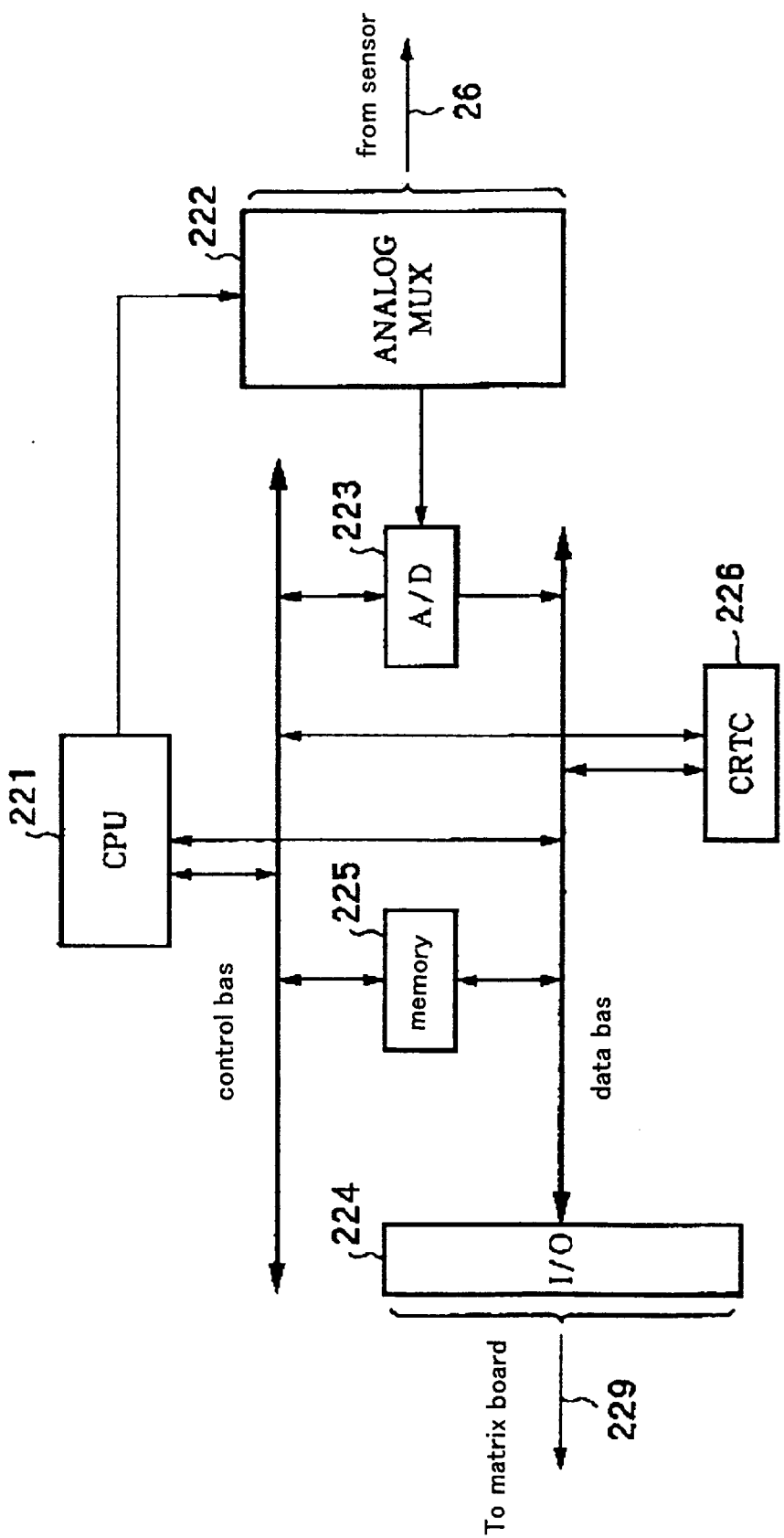
F I G. 27

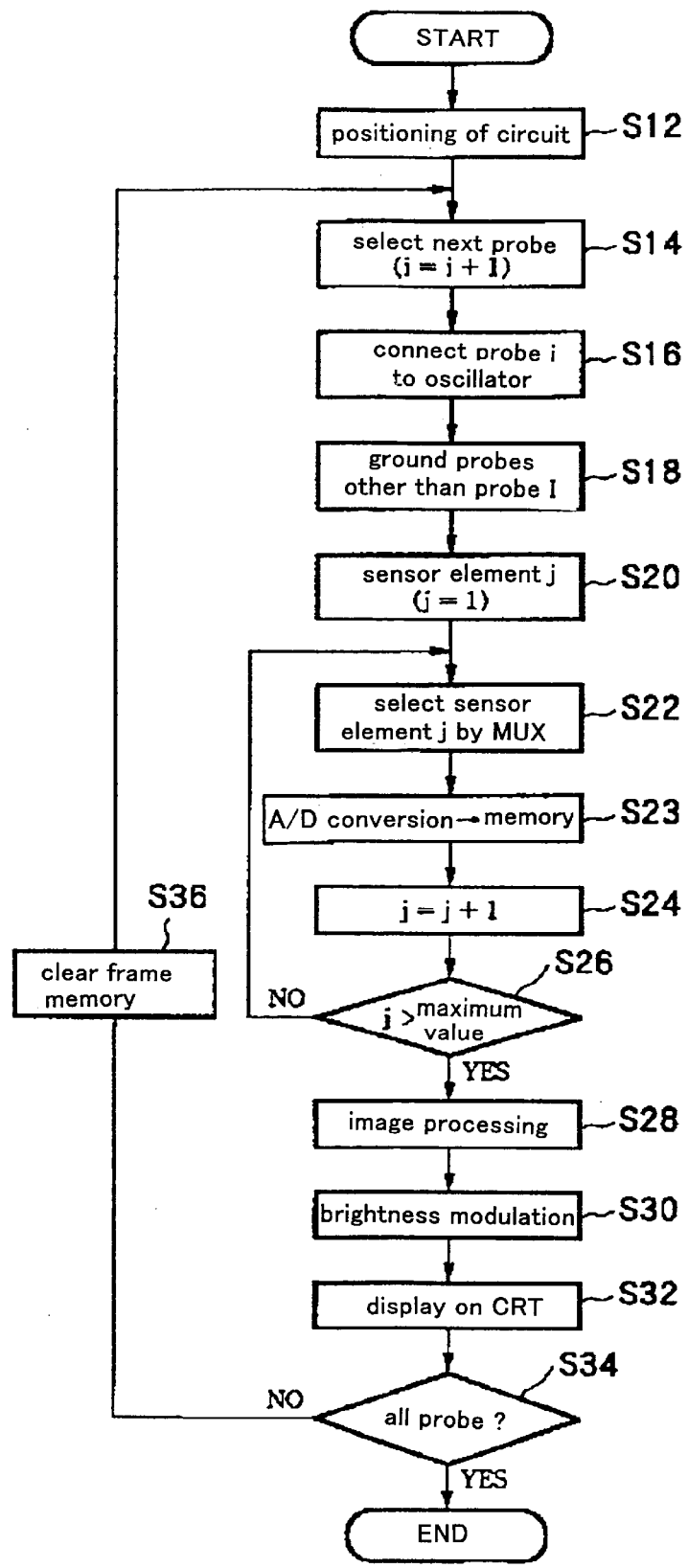
F I G. 2 8

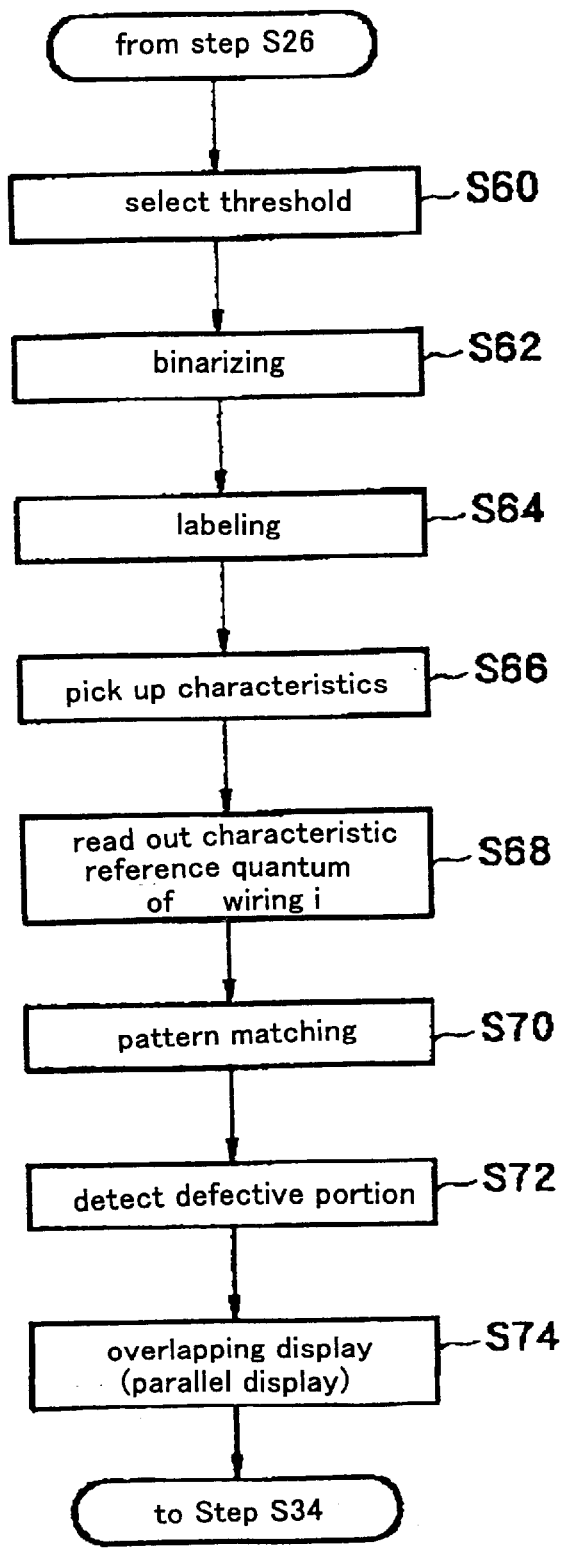
F I G. 3 1

SENSOR PROBE FOR USE IN BOARD INSPECTION AND MANUFACTURING METHOD THEREOF

BACKGROUND OF THE INVENTION

1. Field of the invention

The present invention relates to a sensor probe for use in board inspection, more particularly to a sensor probe for inspecting a circuit board having a microscopic wiring pattern, and a manufacturing method thereof.

2. Prior Art

For inspecting a circuit board having a microscopic pattern, an inspection signal has hitherto been applied to a number of pins which had been pressed to respective terminals of a board as an object to be inspected. In this method, a rubber sheet is provided on the board in order to reduce the load which is caused from the press of the number of pins and applied to the board. This often causes a problem of loose connection due to the rubber sheet interposed between the pins and the board.

To solve this problem, for example, in Japanese Patent Laid-Open Publication No.

Hei 9-264919, applied for by the present applicants, there is provided a method for inspecting a defect of a board in such a way that a signal is picked up on a non-contact basis by use of a probe (electrode) having a size lager than a width of a wiring pattern as an inspecting object.

Japanese Patent Laid-Open Publication No. Hei 8-278342 also discloses electrodes (stimulator) 11A and 11B for generating an inspection signal toward a board and a plurality of electrodes 12A, 12B, 12C, . . . for receiving a radiation signal from the board, as shown in FIG. 1.

The common idea among Japanese Patent Laid-Open Publications Nos. Hei 9-264919 and Hei 8-278342 is to inspect a plurality of pattern lines by an electrode having a size as large as that capable of covering the pattern lines in a lump and also on a non-contact basis.

Sensor probes which are used in Japanese Patent Laid-Open Publications Nos. Hei 9-264919 and Hei 8-278342 are intended to inspect a circuit pattern having a pitch and size as large as those of a typical printed circuit board, and their integration degree is in low level. Therefore, subject to forming their sensor electrode portion by means of a particular process, such as machining and simplified etching, sufficient accuracy would be obtained.

In those sensor probes of the prior art, the electrode having the size as large as that capable of covering a plurality of pattern lines is used to eliminate the need for high alignment accuracy. Thus, these sensor probes can neither inspect a particular size of circuit pattern, for example approximately 50 $\mu$m or not greater than 50 $\mu$m, with high resolution, nor apply to a circuit board in which the wiring pattern branches along its way. In addition, it is impossible to inspect a defective status in which the pattern is not completely broken and is partly chipped away.

SUMMARY OF THE INVENTION

It is an object of the present invention to provide a method of manufacturing a microscopic board sensor probe through a semiconductor process, and further to provide a circuit board sensor probe having a structure suitable for microscropic size.

According to one aspect of the present invention proposed to achieve the object described above, there is provided a manufacturing method of a sensor probe for use for board inspection as follows, in a manufacturing method of a sensor probe for use in board inspection, the sensor probe comprising layers which include an electrode layer, a lead wire layer and a bridge layer, the layers being laminated on a base in formed of a flat plate composed of either of silicon and silicon oxide, the electrode layer being comprised of a set of sensor electrodes, the lead wire layer being comprised of a set of lead wires for transferring a signal to outside, the bridge layer coupling between the electrode layer and the lead wire layer, the method comprising steps of: forming the lead wire layer by making a set of lead wires prepared by means of forming a film from a predetermined conductive material on the base in accordance with a first mask pattern; forming the bridge layer by making each of the bridge wires prepared by means of growing a film formed from a predetermined conductive material in the direction perpendicular to the base, the bridge wires being respectively connected to respective lead wires of the lead layer and being extended in the direction perpendicular to the base; and forming the electrode layer by making a set of sensor electrodes prepared by means of forming a film from a predetermined conductive material in accordance with a second mask pattern, the plurality of sensor electrodes being respectively extended in the horizontal direction and having a predetermined area.

In this method, each layer as sensor elements is substantially formed by using a semiconductor process so that it may meet the requirements of making sensor elements of microscopic size or optional requirements on the figuration of the electrode.

According to another aspect of the present invention, there is provided a sensor probe for use in board inspection as follows, in a sensor probe for use in board inspection, wherein layers which include an electrode layer, a lead wire layer and a bridge layer are laminated on a base in formed of a flat plate composed of either of silicon and silicon oxide, the electrode layer being comprised of a set of sensor electrodes, the lead wire layer being comprised of a set of lead wires for transferring a signal externally, the bridge layer coupling between the electrode layer and the lead wire layer, the sensor probe comprising: the lead wire layer including a plurality of lead wires which are formed on the base and are connected to an outside pad; the bridge layer including a plurality of bridge wires which are respectively connected to respective lead wires of the lead layer and are extended in the direction perpendicular to the base; and the electrode layer including a set of sensor electrodes which respectively extend in the horizontal direction from respective lead wires and have a predetermined area. In respective sensor elements, the electrodes and the bridge wires are arranged in the vertical direction so that the entire size of the probe may be maintained even when number of sensor elements are arranged in the direction along a surface of the base. This results in a high degree of integration.

According to a preferred embodiment of the present invention, the electrode layer is formed in the surface direction by means of forming a film from either of aluminum and copper. Thus, adequate electrode functioning may be assured due to the resulting area.

According to another preferred embodiment of the present invention, the bridge layer is formed in the vertical direction by means of growing either of aluminum and copper so that the bridge wires may be thinned.

According to other preferred embodiment of the present invention, the lead wire layer is formed in the surface direction by means of forming a film from either of aluminum and copper or growing either of aluminum and copper.

When making the probe microscopic, problems, such as a cross talk between each sensor or noise from other sensor outputs, occur. Thereat, according to still other preferable embodiment of the present invention, a cross-sectional area of each bridge wire is set in smaller than an area of each electrode. Then an electrical shield layer, which is provided between the electrode layer and the lead wire layer making the electrical shield layer not to contact each bridge wire, is formed by means of forming a film from a predetermined conductive material in accordance with a third mask pattern, the electrical shield layer being extended in the direction along the flat surface of the base.

When such a shield is made of metals, insulation would be a key factor. Thus, according to yet other preferable embodiment of the present invention, a first insulation layer is provided between the electrode layer and the lead layer, and each bridge wire of the bridge layer is formed penetrating the first insulation layer.

In the same objective described above, according to further preferable embodiment of the present invention, a second insulation layer is provided between the electrode layer and the shield layer, and a third insulation layer is provided between the shield layer and the lead layer, wherein the second insulation layer and the third insulation layer are coupled each other in the vicinity of respective bridge wires. This enables each bridge wire to be assured not to electrically connect to any of the shield layers.

According to still further preferable embodiment of the present invention, each electrode of the electrode layer is provided horizontally on the flat surface of the circuit board as an inspecting object.

A pad is necessary for outputting an external signal due to the microscropic-sized lead wires. Thereat, according to yet further preferable embodiment of the present invention, each lead wire of the lead wires is connected to respective pads.

According to the remaining embodiment of the present invention, the predetermined conductive material is either of aluminum and copper.

The microscopic size results in weakened output from the sensor element. Thus it is desirable to execute signal conditioning in the proximity of the sensor. Thereat, according to the remaining embodiment of the present invention, a signal conditioning circuit is formed in the base.

BRIEF DESCRIPTION OF THE DRAWINGS

FIG. 6 is a cross sectional view showing a structure of a sensor element according to an embodiment of the present invention:

FIG. 8 is a perspective view illustrating one step of a process for forming a sensor element by use of the semiconductor process:

FIG. 9 is a perspective view illustrating one step of a process for forming the sensor element shown in FIG. 6 by use of the semiconductor process:

FIG. 10 is a perspective view illustrating one step of a process for forming the sensor element shown in FIG. 6 by use of the semiconductor process:

FIG. 11 is a perspective view illustrating one step of a process for forming the sensor element shown in FIG. 6 by use of the semiconductor process:

FIG. 12 is a perspective view illustrating one step of a process for forming the sensor element shown in FIG. 6 by use of the semiconductor process:

FIG. 13 is a perspective view illustrating one step of a process for forming the sensor element shown in FIG. 6 by use of the semiconductor process:

FIG. 14 is a perspective view illustrating one step of a process for forming the sensor element shown in FIG. 6 by use of the semiconductor process:

FIG. 15 is a perspective view illustrating one step of a process for forming the sensor element shown in FIG. 6 by use of the semiconductor process:

FIG. 21 is an explanatory view showing a distribution of output values from each sensor element of the sensor board shown in FIG. 20:

FIG. 22 is an explanatory view showing an appearance of a distribution of output values from each sensor element of the sensor board shown in FIG. 20, when indicating with the brightness modulation:

FIG. 24 is an explanatory view showing a distribution of output values from each sensor element of the sensor board shown in FIG. 23:

FIG. 25 is an explanatory view showing a display of a distribution of output values from each sensor element of the sensor board shown in FIG. 23, when indicating with the brightness modulation:

FIG. 27 is a diagram illustrating a structure of a controller according to an embodiment of the present invention:

FIG. 28 is a flow chart illustrating a control procedure according to an embodiment of the present invention:

FIG. 31 is a flow chart illustrating a control procedure according to a modification in automation for detecting a defect:

DETAILED DESCRIPTION OF THE PREFERRED EMBODIMENTS

With reference to accompaning drawings, preferred embodiments of the present invention will be described hereinafter.

Figure 1:
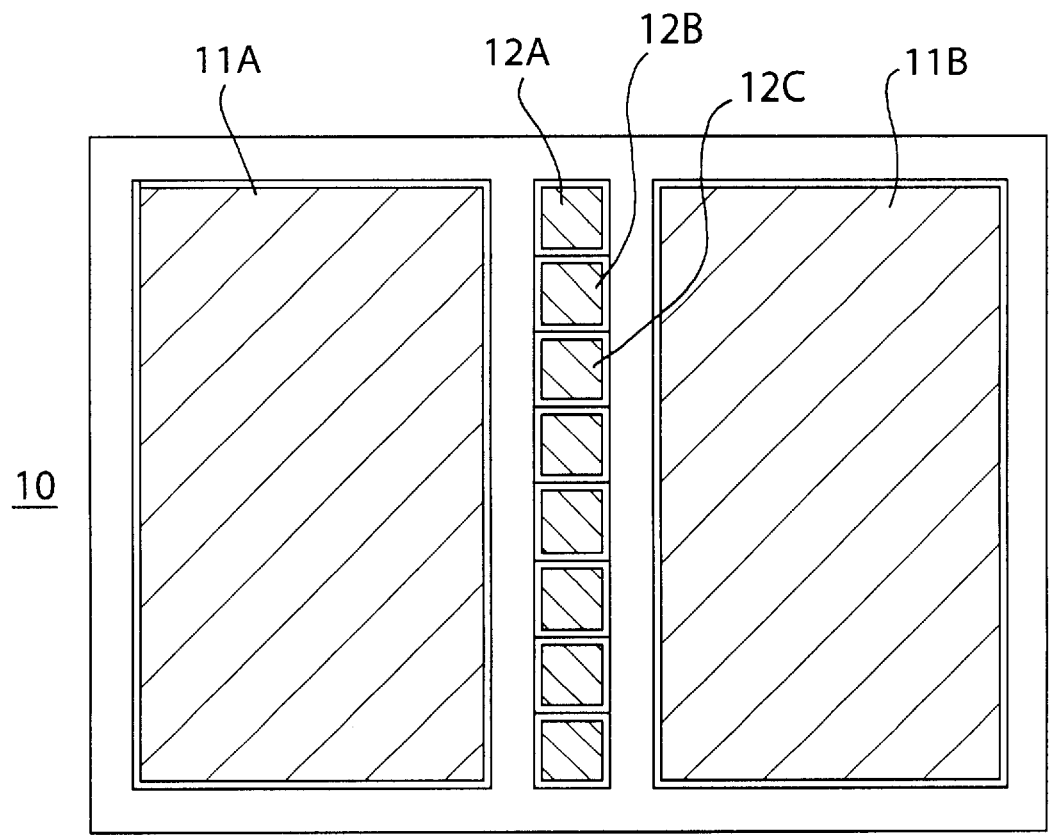
FIG. 1 is a schematic view showing an example of a conventional inspection device.
Figure 2:
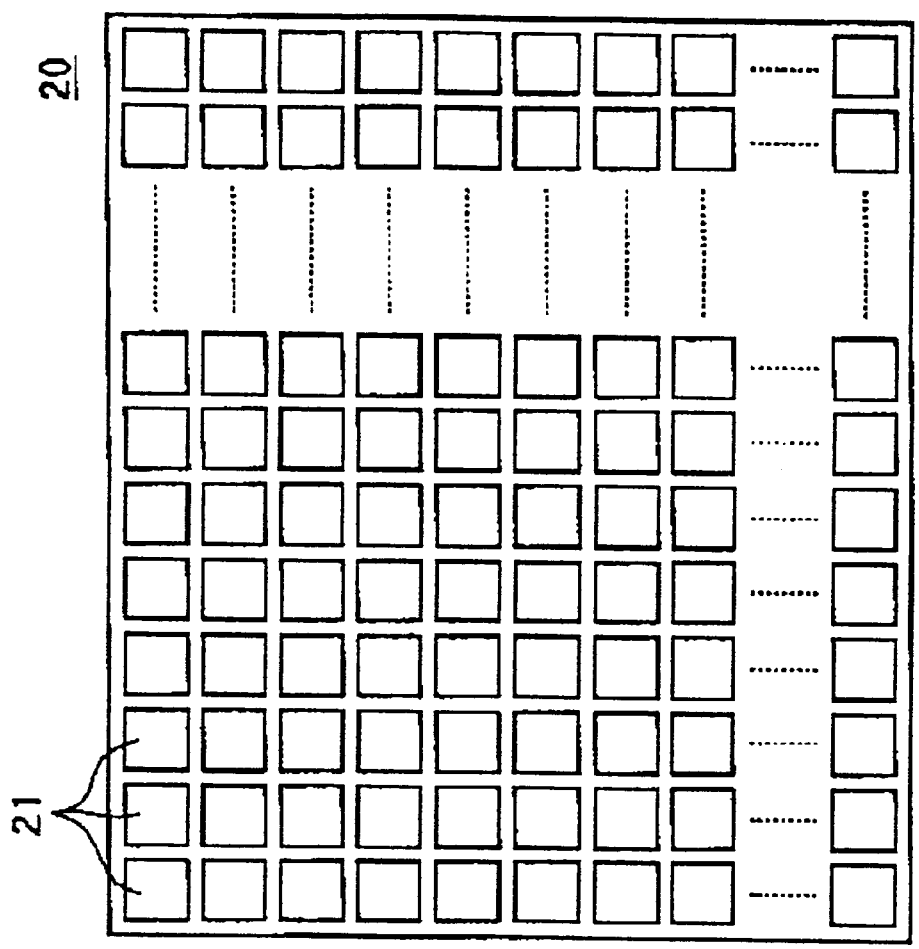
FIG. 2 is a bottom plan view illustrating an structure of an area type sensor probe board according to an embodiment of the present invention.
Figure 3:
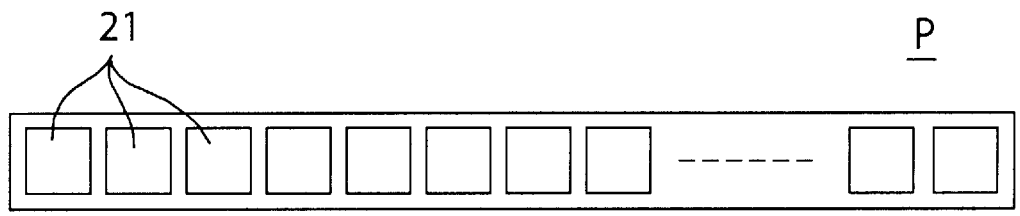
FIG. 3 is a bottom plan view illustrating an structure of a line type sensor probe board according to an embodiment of the present invention.

FIG. 2 is a bottom plan view showing a structure of an area type sensor probe board and FIG. 3 is a bottom plan view showing a structure of a linear type sensor probe board P, for use in the present inspection system.

In FIG. 2, the area type sensor probe board 20 includes number of sensor elements 21, 21, . . . , 21 two-dimensionally disposed at even intervals. The linear type sensor probe board P shown in FIG. 3 also includes a plurality of sensor elements 21, 21, . . . , 21 disposed in a line. In both of the sensor probe board 20 shown in FIG. 2 and the sensor probe board P shown in FIG. 3, each sensor element is spaced apart from other sensor elements, and a shield is provided between respective sensor elements for isolation with respect to electromagnetic radiation (i.e. electric field or magnetic field).

The size of each sensor element is determined depending on the line width of a pattern line in a circuit board as an object to be inspected. The size of one sensor element is preferably less than that of the line width of the pattern line to specify a defective portion of the pattern line. In this embodiment, assume that the line width of the pattern line is one third of the width of the one sensor element to make the following description clear.

Figure 4:
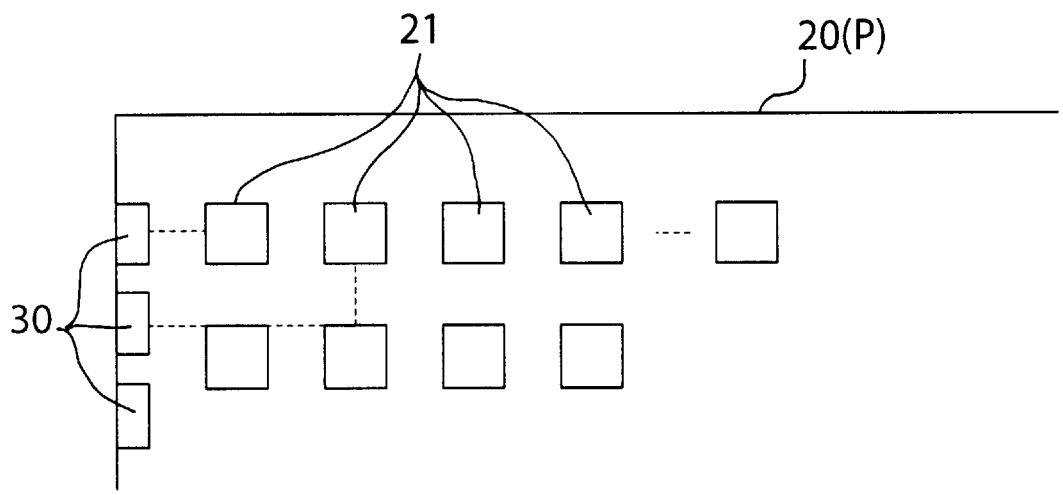
FIG. 4 is a partial enlarged view illustrating an arrangement of a pad and a sensor element in the area type sensor probe board.

In FIG. 4, showing a connection between sensor elements 21, 21, . . . , 21 and corresponding pads 30, 30, . . . , 30, the sensor elements and the pads are respectively connected through lead wires (shown as dotted lines) which are imbedded within the board 20 (or P) in whole.

The present sensor probe board is produced by a semiconductor manufacturing process to inspect a microscopic wiring pattern. Since a distance between adjacent pads inevitably becomes narrow in such a board, a lead wire (not shown) which picks up a signal from each pad is connected by the bonding method.

Figure 5:
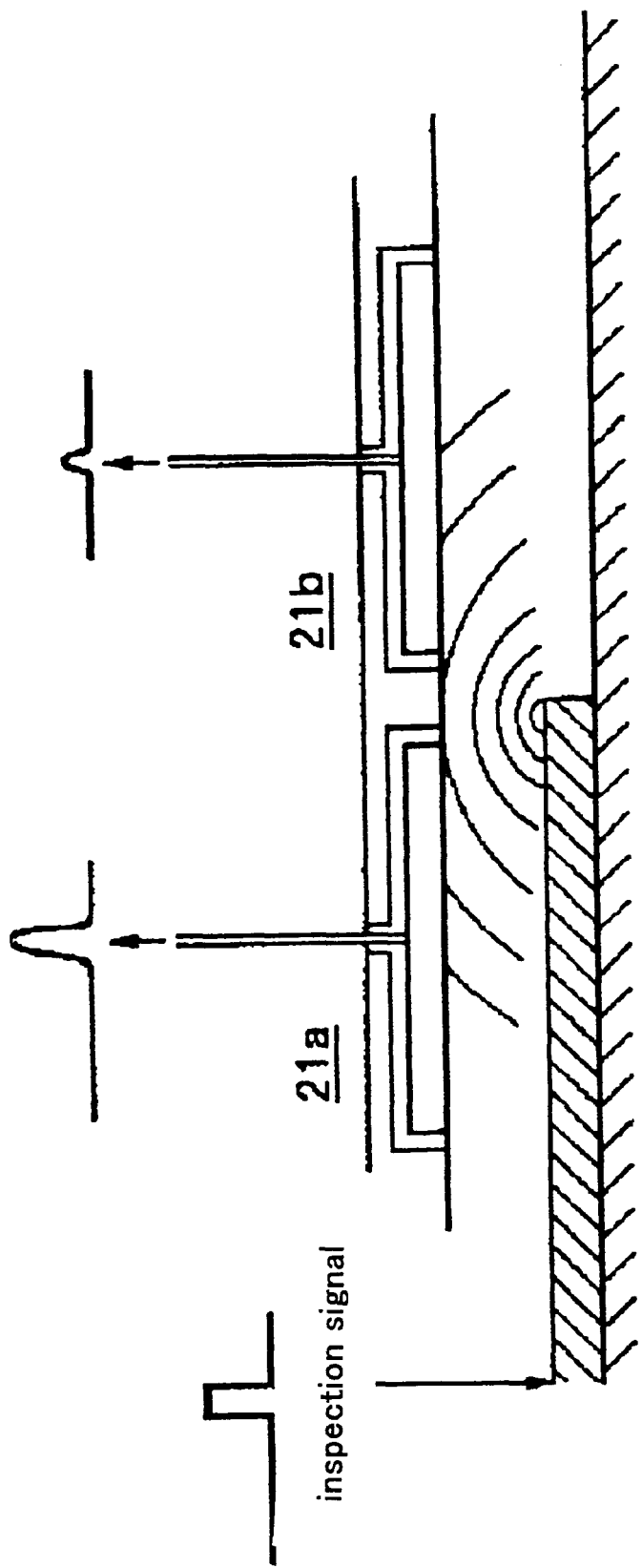
FIG. 5 is an explanatory view depicting the condition where radiation is emitted from a pattern of a board to a sensor element.

FIG. 5 depicts the condition where radiation is emitted from an edge portion of this pattern line by applying an inspection signal including an alternating current component to the pattern line to the object to be inspected, and then the radiation reaches each sensor element 21a, 21b. In the example shown in FIG. 5, since the pattern line is not extended to the sensor element 21b, the radiation received by the sensor element 21b is weaker than that received by the sensor element 21a, and the amplitude of the radiation received by the sensor element 21b is also less.

Under condition shown in FIG. 5, the size of each sensor element according to the present invention is adapted to respectively determine its microscopic size in proportion to the difference in intensity of respective received signals caused from difference in distance between each sensor element and the pattern line.

Figure 7:
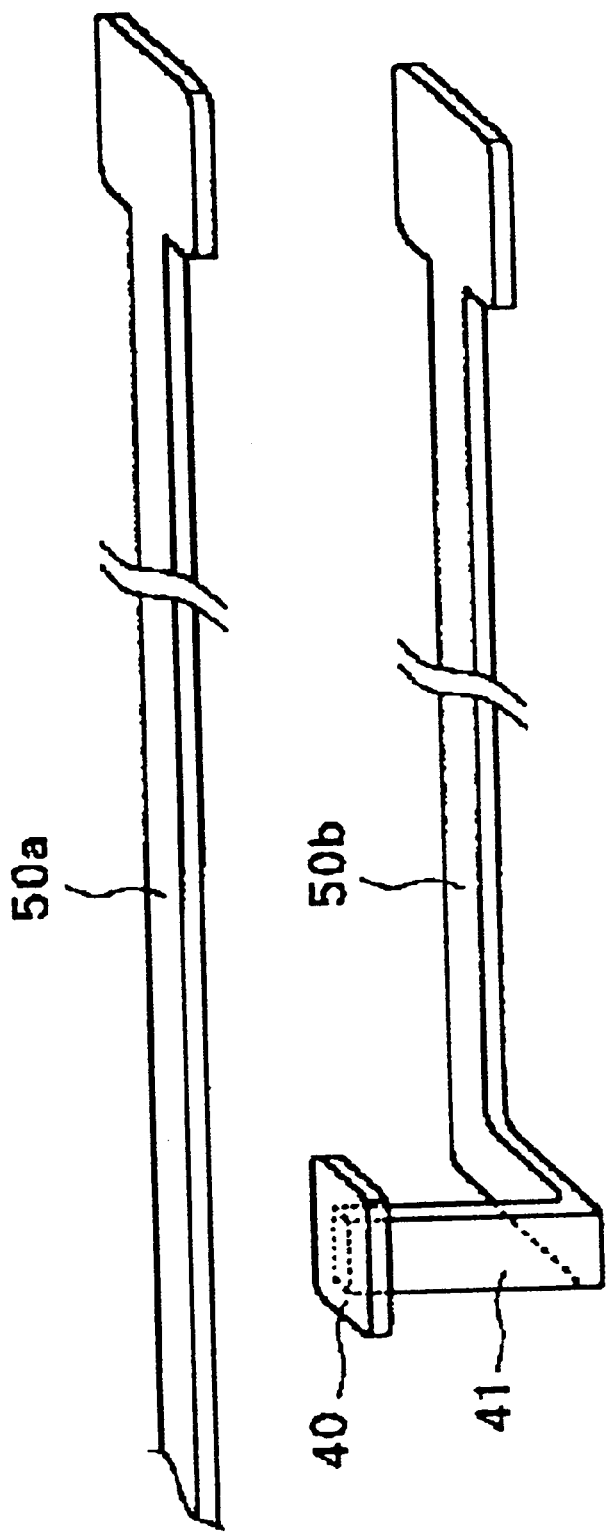
FIG. 7 is a perspective view illustrating an arrangement of an electrode, a bridge wire and a lead wire in a sensor element.

FIG. 6 is a cross sectional view showing one example of one sensor element. An insulation layer 31 made of silicon dioxide (SiO2) is formed on a base as the lowest layer made of silicon (Si). With additional reference to FIG. 7, a bridge pole 41 is formed on the insulation layer 31, extending upwardly. A sensor electrode plate 40 is formed at top of the bridge pole 41. The bridge pole 41 and the electrode plate 40 form one of the sensor elements. The bridge pole 41 is connected to a lead wire 50b (a lead wire 50 in FIG. 6) made of aluminum or copper. A lead wire 50a shown in FIG. 7 is of another sensor element (not shown).

The bridge pole is provided for bridging between the electrode of the sensor element and the lead wire. It is advantageous for improving the integration degree to have a column-like shape.

With reference to FIG. 6, a wiring layer is formed on the insulation layer 31. This wiring layer includes lead wires 50, 50a and 50b which transmits a signal detected by the sensor to the pad (the lead wires 50a, 50b are shown in FIG. 7). A shield layer 33 is formed above the wiring layer 50 with an interposing first insulation layer between the shield layer 33 and the wiring layer 50 in order to insulate therebetween. This insulation layer is formed from SOG (spin of glass). That is, the shield layer 33 is formed on the insulation layer 32.

Insulation layers 34 and 35 are formed on the shield layer 33. Both of the insulation layers 34 and 35 include SOG (spin of glass). Providing two insulation layers having the same material each other grounds is a factor related to the manufacturing process, as described below.

The electrode plate 40 located on the bridge pole 41 has an area according to the line width of the circuit board as an inspecting object. A top surface of the electrode plate 40 may have a curvature in cross section appropriate to a shape in cross section of the wiring pattern as an inspecting object.

The shield plate 33 prevents the electrode plate 40 from picking up a signal, which is received by other sensor element, from a lead wire (referred to as 50x) through which this signal is passed. Thus, high SN ratio is assured by the shield plate 33.

The SOG which is extending from the insulation layer 34 is interposed between the bridge pole 41 and the shield plate 33 so that the bridge pole 41 is insulated from the shield plate 33.

The structure of the bridge pole 41 is shown as one example. It is to be understood that any other structure may be achieved by various known methods or processes.

In the sensor probe board described in FIG. 6 and FIG. 7, since it is necessary for each sensor element to be of microscopic size, the sensor probe board is manufactured using the semiconductor process.

With reference to FIG. 8 to FIG. 16, one example of the manufacturing process of the present probe sensor board 20 (P) will be described. While FIG. 8 to FIG. 19 show steps for manufacturing only one sensor element, for simplifying its description, it should be understood that the following description implies steps for forming all of the sensor elements by the semiconductor process.

In the first step, shown in FIG. 8, the insulation layer 31 of silicon dioxide is formed by oxidizing a surface of the silicon base. The oxidization is, for example, carried out by placing the base 30 in a CVD apparatus (not shown) and then providing an oxygen gas to the apparatus.

After the insulation layer 31 of silicon dioxide is formed, the wiring layer 50 is formed. In this step, a photo resist layer is formed on a surface of the insulation layer 31, and the surface is then exposed through a mask pattern in which a pattern of lead wires of all sensor elements is formed. Then, the photo resist layer is removed and a reaction gas including aluminum element is then provided to the CVD chamber to form a pattern of the lead wire on the insulation layer 31 as shown in FIG. 10.

Then, the shield plate layer 33 composed of aluminous metal is formed on the insulation layer 32 as shown in FIG. 11.

Then, an opening is formed in the shield plate layer 33 by eliminating part of the aluminum of the shield plate layer. The size of the opening 70 may be set as large as that allowing SOG to be interposed between the bridge pole 41 and the shield plate 33 to make the bridge pole 41 not to contact to the shield plate 33. In other word, the opening 70 has a cross sectional area larger than that of the bridge pole 41. Since a bridge pole 41 will be formed in the opening 70 afterward, a position of the opening 70 (i.e. a mask pattern in which the opening 70 is formed) is adapted to enable the bridge pole 41 to be connected to a lead wire 50b at the time when the opening is formed.

For forming the opening 70, an inactive film is applied except in the area where the opening 70 is to be formed, and a reaction gas for eliminating the aluminum is then introduced into the CVD chamber. Since this reaction gas does not react with a SOG layer 32, any layers under SOG is not eliminated.

As shown in FIG. 13, the insulation layer 34 composed of SOG is formed on the shield plate layer 33 in which the opening 70 is formed. In this operation, SOG enters the opening 70 to form the insulation layer 34.

The steps shown in FIG. 14 include a step for applying an inactive layer on the insulation layer 34, a step for forming an opening 80 in the inactive layer, and a step for forming the bridge pole 41 as shown in FIG. 6.

The opening is provided for forming the bridge pole 41 later. As described above, since the bridge pole 41 is required not to contact to the shield plate 33, the size of the opening 80 is smaller than that of the opening 70, while the opening 80 which defines a position of the bridge pole 41 is positioned to be a concentric circle (or a concentric rectangle) with respect to the opening 70, and a size of the bridge pole 41 which is positioned to contact the lead wire 50b is larger than that of the opening 70.

This step begins with applying the inactive layer on the insulation layer 34. A part of the inactive layer where the opening 80 is formed is eliminated by an exposure treatment.

Then, the SOG of the insulation layer 34, the SOG in the opening 70 and the SOG of the insulation layer 32 are respectively eliminated by introducing the inactive gas into the CVD chamber.

A hole 81 resulting from this SOG elimination treatment may extend from the insulation layer 34 up to the wiring layer 50.

Figure 16:
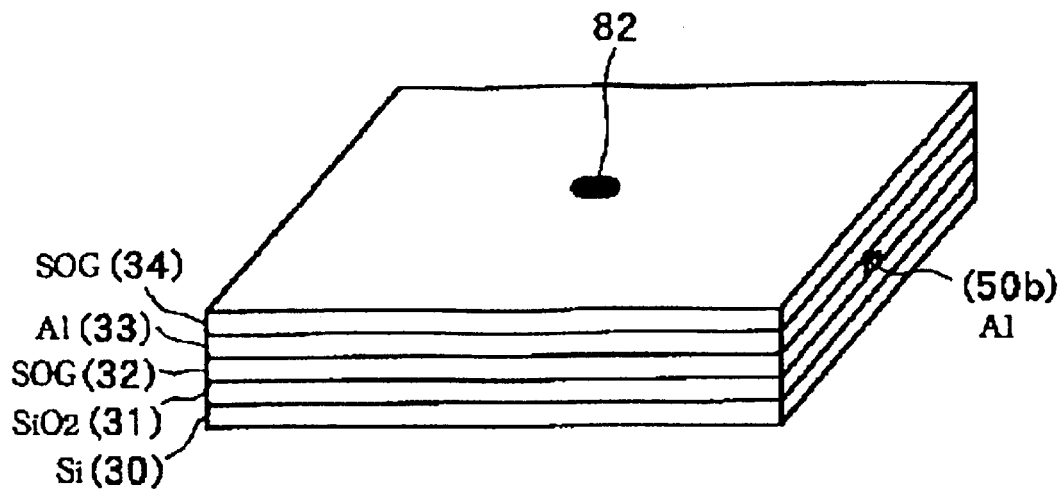
FIG. 16 is a perspective view illustrating one step of a process for forming the sensor element shown in FIG. 6 by use of the semiconductor process.

Then, a film is formed with aluminum metal within the hole 81 by introducing an activated gas which contains aluminum. By means of this film-formation, the resulting film reaches to the aluminum film of the wiring layer 50, thereby the bridge pole 41 which extends from the wiring layer 50 to the top of the insulation layer 34 is formed. As shown in FIG. 16, an inactive layer is eliminated because of no necessity thereof. The top of the bridge pole 41 corresponds to the surface of the insulation layer 34.

Figure 17:
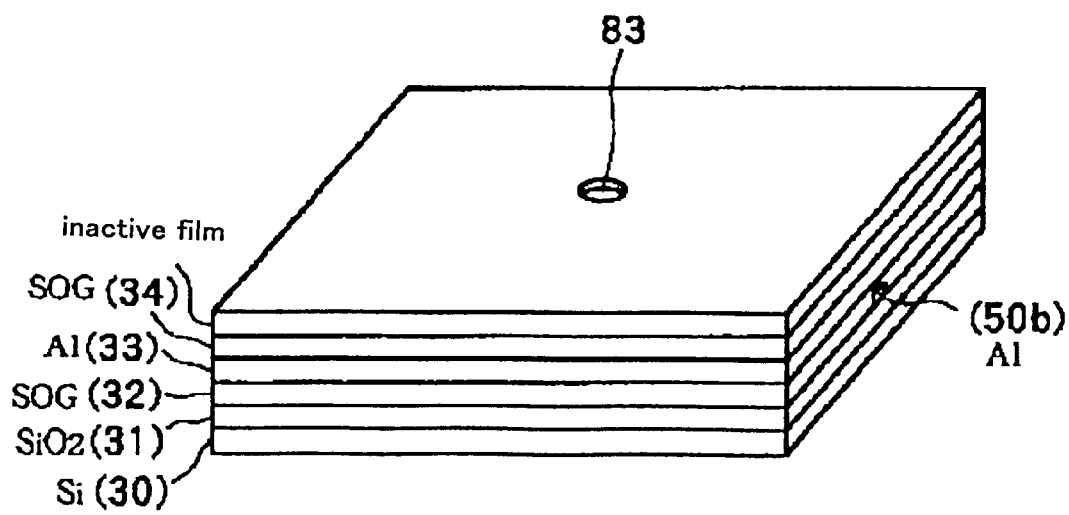
FIG. 17 is a perspective view illustrating one step of a process for forming the sensor element shown in FIG. 6 by use of the semiconductor process.
Figure 18:
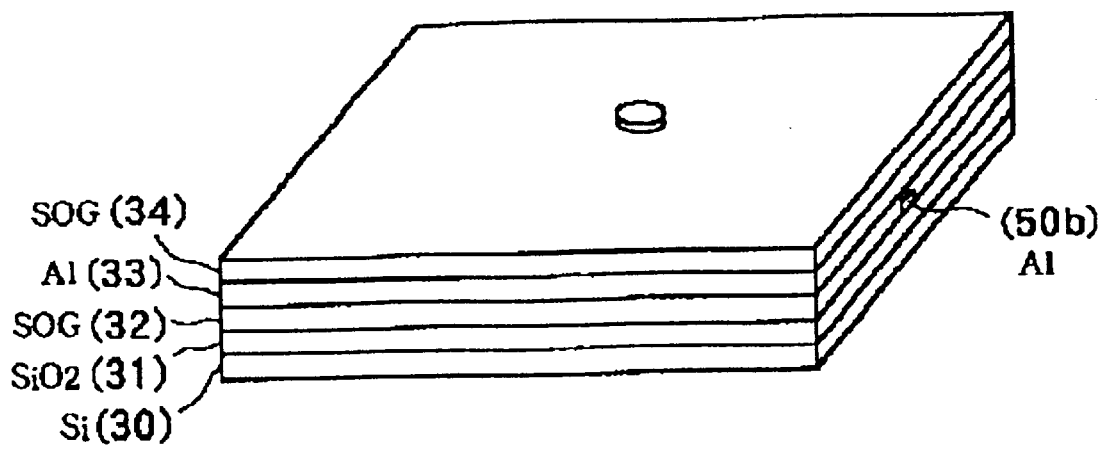
FIG. 18 is a perspective view illustrating one step of a process for forming the sensor element shown in FIG. 6 by use of the semiconductor process.

With reference to FIG. 17, a step for forming the electrode 40 will be described. This step begins with applying an inactive layer on the insulation layer 34, an opening 83 is provided in a resulting inactive film by eliminating the film material in an area where the opening 83 is positioned, as shown in FIG. 17. A film is formed within the opening 83 by introducing an inactive gas which contains aluminum into the CVD chamber and then the inactive film is removed. As a result, as shown in FIG. 18, the electrode is formed on the bridge pole 41. Any shape may be applied to the opening 83, while the position of the opening is required to correspond to the position of the bridge pole 41 (i.e. the position of the mask pattern for forming the opening 70).

Figure 19:
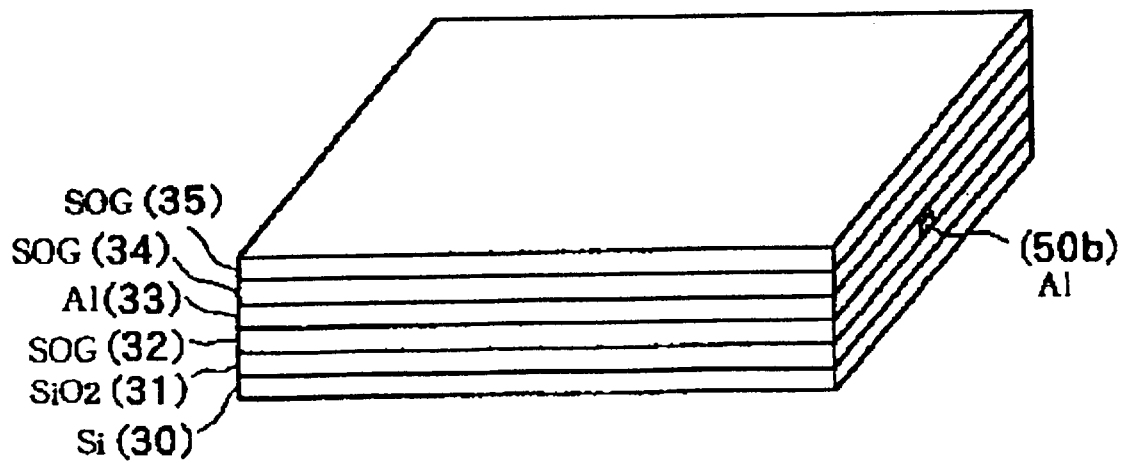
FIG. 19 is a perspective view illustrating one step of a process for forming the sensor element shown in FIG. 6 by use of the semiconductor process.

As the last step, the insulation layer 35 is also formed as shown in FIG. 19. This insulation layer 35 functions to insulate and protect the electrode 35.

Through the above steps, the sensor probe board having a cross sectional structure shown in FIG. 6 is accomplished. In this process, a grinding step may be accompanied for assuring evenness of the sensor surface.

It should be understood that a manufacturing process according to the present invention is not limited to the process shown in FIG. 8 to FIG. 19.

In the process shown in these drawings, the bridge pole 41 was formed after the insulation layer 34 had been formed. This was for preventing the bridge pole 41 from being formed having a curved shape by forming the film with aluminum in the longitudinal direction of the bridge pole all at once. However, it is unnecessary for a sensor of the present invention to have an integration degree such as IC and LSI and so some level of curvature in the bridge pole 41 never causes any problem. Therefore, it is possible to modify to another process in which a hole for use in forming the bridge pole 41 is formed at different times when each layer is formed.

[Inspection System: Sensor Element and Display Device]

Figure 20:
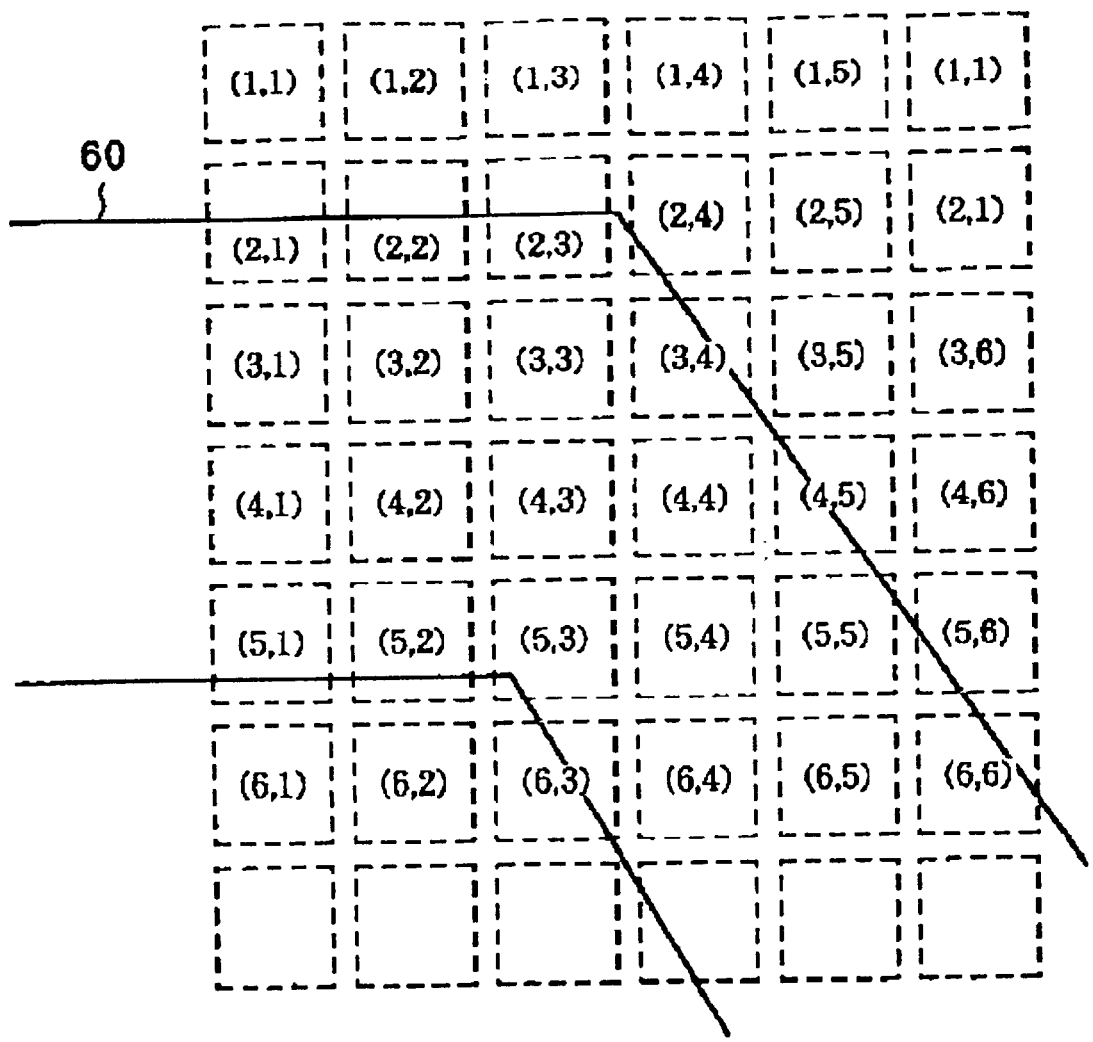
FIG. 20 is an explanatory view showing an arrangement of a normal circuit pattern as an inspecting object and a sensor probe board.

FIG. 20 shows the physical relationship between a sensor board 20 according to the embodiment and one wiring pattern line 60 when the line is inspected by using the sensor board.

In FIG. 20, (1,1), (1,2), . . . indicates coordinate values which represents a position of each sensor element for a precise designation. The pattern line 60 covers, for example, about one third of the sensor elements as shown. The sensor elements may output different signals in accordance with the distance from respective sensor elements to the pattern line.

FIG. 21 shows a distribution on the signals which may be obtained by the physical relationship between the pattern line and the sensor elements shown in FIG. 20. Each relative intensity of received signals is indicated for each position of sensor element in FIG. 21 by a numerical number from 0 to not more than 100, in particular, each numerical number is a relative value of a received signal detected by each sensor element where the received signal is 100 when a received signal corresponding to an applied signal has the highest intensity. As one can see in FIG. 21, the distribution of the signal intensity is generally shown in parallel with the distribution of metal portions of the pattern line.

FIG. 22 shows a result in which each relative intensity of the sensor element outputs is indicated on a display device, such as CTR, with the brightness modulation. Thus users may know the wiring pattern just by looking at the distribution indicated on a CRT display device.

Figure 23:
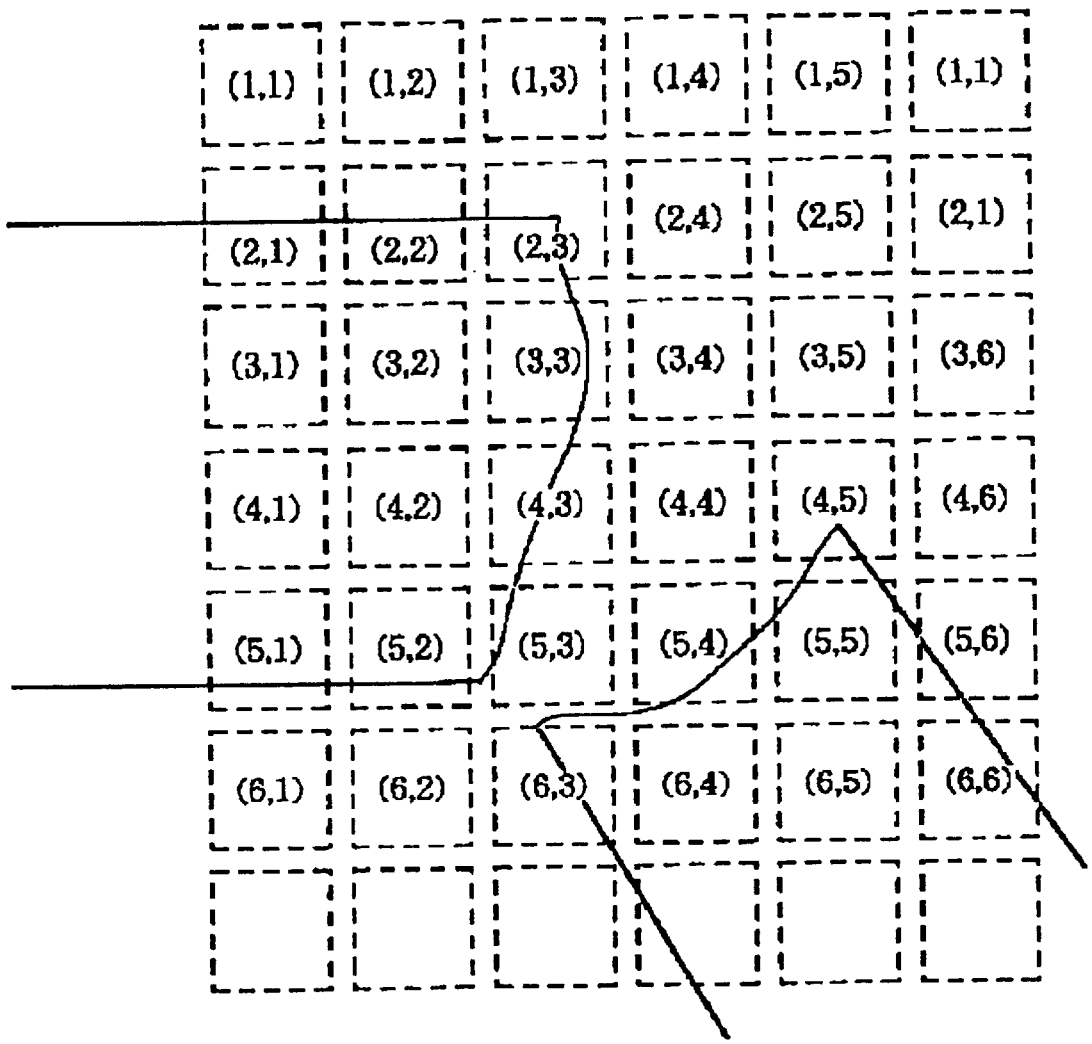
FIG. 23 is an explanatory view showing an arrangement of a defective circuit pattern as the object inspected and a sensor probe board.

FIG. 23 shows a distribution on each relative value of the signal intensity in the case where a pattern line having a breakage is inspected. FIG. 24 shows a distribution on each relative value of the signal intensity in the case where a pattern line in FIG. 23 is inspected. FIG. 25 shows a indication of the signal in FIG. 24 with the brightness modulation. When checking the distribution of the brightness under normal conditions, users may determine a breakage position or a short-circuit position from this distribution of brightness.

[Inspection System: Configuration]

Figure 26:
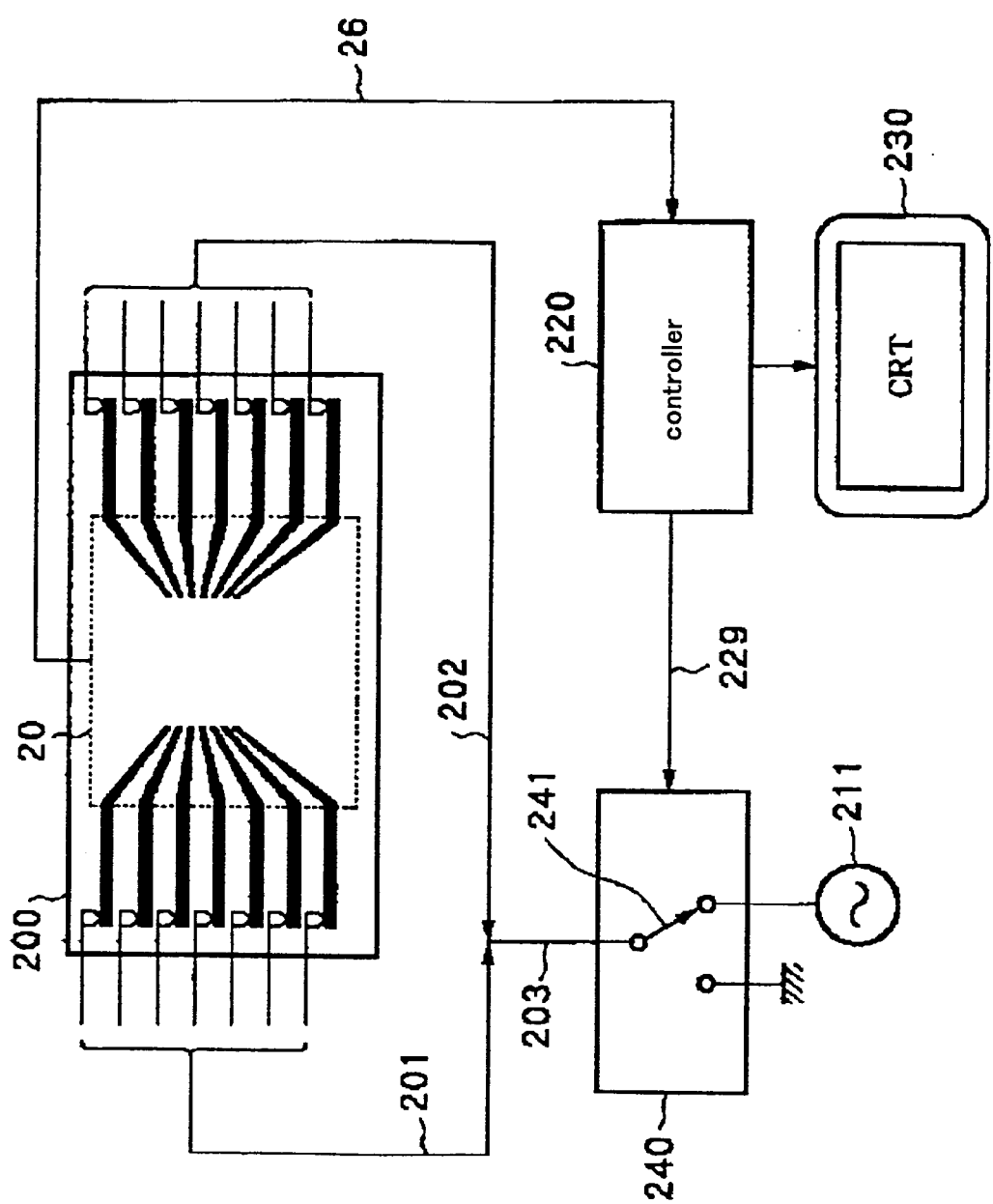
FIG. 26 is a diagram illustrating a structure of an inspection system according to an embodiment of the present invention.

FIG. 26 shows a system configuration of a inspection system according to the present invention.

In this diagram, the reference number 200 indicates a circuit board as an object to be inspected, which is disposed on a mounting base (not shown). The sensor board is mounted in non-contact condition above a microscopic pattern area where it is particularly desired to inspect the circuit board 200.

While the sensor probe board 20 includes the pads 30 for picking up a output of each sensor element as described in FIG. 4, the pads are not shown and each signal line from the pads is shown converging into a cable 26, for simplifying the diagram in FIG. 26.

The probes are respectively connected to each pattern line which is indicated with wide line width in the circuit board 200. In an example shown in FIG. 26, an inspection signal from a particular oscillator 211 is applied to a group of left side probes via a cable 201, and to a group of right side probes via a cable 202.

The reference number 240 indicates a matrix board having a predetermined number of built-in analog switches or relays 241. The predetermined number may be adapted to correspond to at least a number of the contact probes. One terminal of each of the switches or relays are grounded, while its other terminal is connected to the oscillator 211. All of the switches or relays are controlled by a controller 220. Preferably, the controller 220 is adapted to connect one of the switches or relays 241 to the oscillator 211 and simultaneously to ground all remaining switches or relays. In this case, the controller outputs a selection signal to input an inspection signal only to one of the probes (i.e. one of the pattern line) and to ground other probes.

All outputs of sensor elements 21, 21, . . . , 21 on the sensor probe board 20 are collectively input to the controller 220.

A configuration of the controller 220 is shown in FIG. 27 a CPU 221 is implemented within the controller 220. The CPU controls an analog multiplexer 222, an A/D converter 223 and an I/O port 224. Hereat signals from the sensor elements in the signal cable are selected in a sequential order by the multiplexer 222, and the analog signals are then converted to digital signals. Then the converted digital signals are retrieved in memory 225.

[Control Steps]

Figure 29:
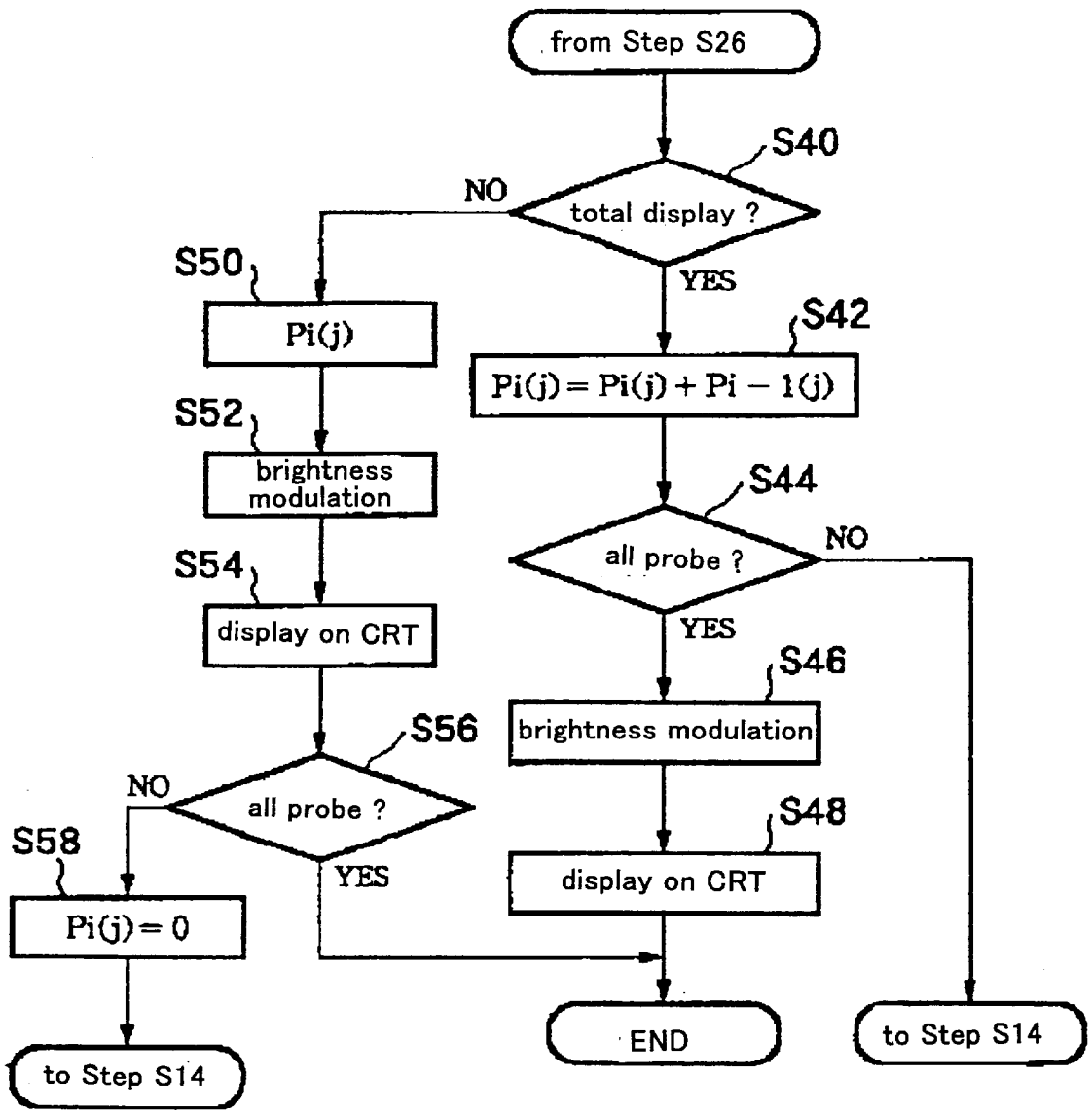
FIG. 29 is a flow chart illustrating a control procedure according to a modification in manner of display.
Figure 30:
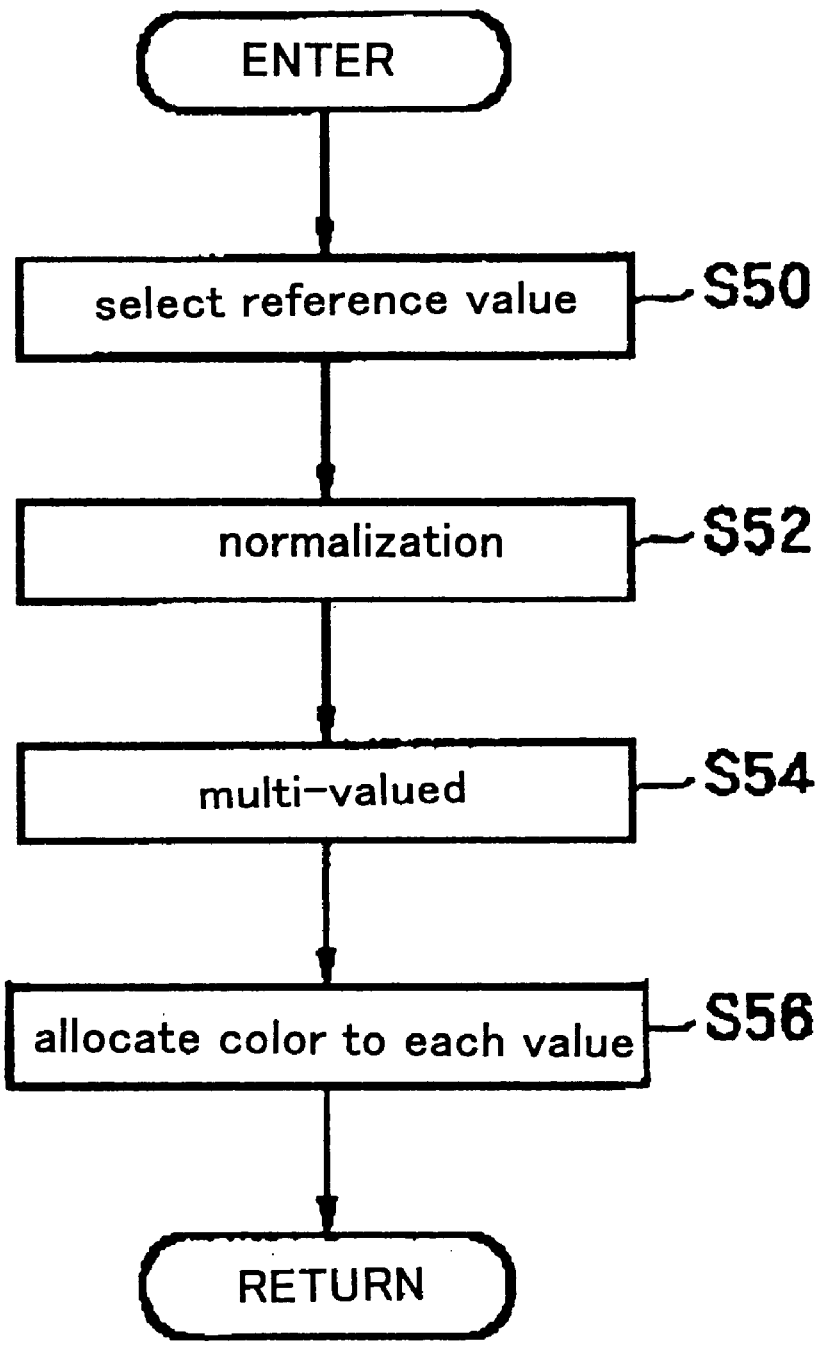
FIG. 30 is a flow chart illustrating a control procedure according to a modification in normalization.

With reference to FIG. 28 to FIG. 30, a control procedure of a inspection system according to the present invention will be described. FIG. 28 is a flow chart showing steps of the entire control procedure. In Step S12, the circuit board as the object to be inspected is positioned. In this positioning, a positioning marker which is located at a predetermined position within the circuit board is detected by means of such as an image processing, and the circuit board is positioned with aligning the maker at a predetermined coordinate value.

In Step S14, one probe to which the inspection signal should be applied is selected. The selected probe is indicated by the reference number i. In Step S16, the probes other than the one selected probe i are grounded. In this selection of the probes, the controller 220 sets up a switch selection signal adapting to make a switch element 241 corresponding to the probe i connect to the oscillator 211 and simultaneously to make the remaining switch elements 241 corresponding to the remaining probes other than the probe i select each associated ground terminal of the remaining switch elements.

As a result, the inspection signal is applied to the wiring pattern connected to the probe i in the circuit board, while all remaining wiring patterns connected to the probes other than the probe i are grounded.

The processing in Step S20 to Step S26 is for converting the analog outputs from the sensor elements 21, 21, . . . , 21 into the digital signals and then retrieving these digital signals. Specifically, a counter of the CPU for designating the sensor element j to be processed is initialized and the numerical value j is set in 1 in Step S20. This information is then input to the multiplexer 222 and an output from the sensor element j is selected by the multiplexer 222 in Step S22. This analog output is converted to a digital signal by the A/D converter 223 and the converted signal is then written into the memory 225 in Step S23. In Step S24, the counter is incremented by 1 to designate a next sensor element j. The above processing is repeated for all sensors through Step S22 to S24.

A judgment signal "YES" in Step S26 means that a numerical value j has been reached for the total number of the sensors and output signal values from all sensor elements of the sensor probe board 20 are also retrieved from the memory 225.

In Step S28, a predetermined image processing is applied to the output signals on the memory 225. Then the processed output signals is displayed on the CRT after being processed with the brightness modulation in Step S32.

Through the above processing, an indication shown in FIG. 22 or FIG. 25 may, for example, be displayed on the CRT display device 230. Users can examine on the probe i the object inspected (i.e. the wiring pattern connected to the probe i) by monitoring this indication.

When users want to inspect other wiring pattern, users can, for example, push or click an icon, such as a "NEXT" button (not shown) displayed on the CRT 230. By this operation, the control procedure is returned from Step S34 to Step S14 to select a next probe i'(i.e. i+1) and the processing following Step S16 is repeated.

In such an indication, it is preferable to display each reference number of the probe and wiring pattern selected as shown in FIG. 22. This reference number of the wiring pattern can easily be known from design data (i.e. CAD data) of the circuit board as an inspecting object. The reference number of the probe can also be known by associating the reference number of the probe with the reference number of the wiring pattern according to the above data. This allows users to examine whether the pattern having a specific reference number which is currently inspected is good or not.

[Total Information Display]

The control procedure is adapted to display an image obtained from the sensor element individually for each wiring pattern on the CTR, in which, when designating a specific pattern line, i.e. a next pattern line, users designate a next pattern line to the system (Step S14).

FIG. 29 shows a flow chart of another control procedure in which the control procedure shown in FIG. 28 is modified in part. In this flow chart, the modified part is particularly shown. A feature of this control procedure is to totally display an image indicating all pattern lines. The flow chart shown in FIG. 29 is of alternating for Step S28 to S34 shown in FIG. 28.

When signals output from all sensor elements are stored in the memory 225 in Step S26 of the control procedure shown in FIG. 28, the procedure goes to Step S40. In Step S40, it is confirmed whether users expect to totally display the information of all pattern lines or to display individually for each pattern line. For making choices from the total and individual information displays, users can designate by use of an icon button (not shown) displayed on the CRT.

When users expect the individual display for each pattern line, the image which is stored in the memory 225 after being obtained from the sensor element for the pattern line i, is displayed on the CRT after processes with the brightness modulation in Step S54. In Step S56, it is confirmed whether users expect to display a next pattern line or not.

When it is confirmed that users expect to display a next pattern line and the displaying operation has not been completed for all pattern lines, the present content of the memory 225 is cleared off in order to prevent the present image from displaying with a next image together, and followed by returning to Step S14.

In Step S40, when it is confirmed that users expect the total information display, the procedure goes to Step S42. In Step 42, the logical OR operation is implemented to logically add the image Pi−1 (i=j) which is previously obtained from the sensor element for the pattern line i−1 to an image Pi (i=j) which is obtained from the sensor element for the pattern line I this time.

This allows images on all pattern lines from 1 to i in the reference number of the pattern line i to be stored in the memory 225.

In Step S44, it is confirmed whether images on all pattern lines is stored in the memory 225. When confirmed that the images on all pattern lines has been stored in the memory 225, this content is displayed on the CRT 230.

[Normalization]

It is preferable to allow the image processing in Step S28 to be adjusted depending on the intended circuit board. One modified example of the image processing is shown in FIG. 30.

With reference to FIG. 30, a technique for allocating predetermined colors individually to respective output values of the sensor elements will be described. In Step S40 (FIG. 29), the CRT is adapted to urge users to select a reference value for indicating each output signal from the sensor elements on percentage. As described in connection with FIG. 21 and so forth, while output signals from the sensor elements are varied according to the distance between the sensor board and the circuit board, such a variation is static in each circuit board. The reference value described above is used in a normalization for tuning output signals from the sensor elements in the dynamic range of the CRT device 250. Hereat, an output from each sensor element is normalized by the selected reference value.

The reference value in Step S50 may automatically be allocated without any selection of users if the circuit board as the object to be inspected can be identified. This may improve the operationality for users. When this system is adapted to allow users to vary the reference value within a predetermined range, for example within 10% in addition to the automatic allocation of the reference value in this system, it is sometimes the case that a hidden defective portion would be displayed.

In Step S56, different colors are allocated respectively to each multi-valued output value. For example, "black" is for the value of "100" because of the existence of the pattern, "red" is for the value of "50" because of the possibility of a breakage of pattern, and "white" is for the value of "00" because of no existence of the pattern.

Such a display distinguished by using different colors may improve performance for identifying a defective portion in the pattern.

[Pattern Recognition]

FIG. 31 shows a flow chart related to a control procedure directed to further improve the performance for identifying a defective portion. This flow chart substitutes for Step S28 to Step S32 of the flow chart shown in FIG. 28.

In Step S60, the CRT is adapted to urge users to select a threshold value for use in the binarizing processing which is executed in Step S62. The output of each sensor element is binarized by using this threshold value in Step S62. In this binarizing processing, the digital signal obtained in Step S23 itself may be binarized and the binarized signal is then stored in the memory.

In Step S64, after the binarized signal is labeled, a seriate region of the binarized signal is detected. In Step S66, a characteristic quantum of each seriate region is picked up. In the normal condition of the pattern line, the seriate region can correspond to one pattern line. Hereat, as the characteristic quantum in the present embodiment, there are following examples; length in the longitudinal direction of the seriate region, length in the orthogonal direction with respect to the longitudinal direction of the seriate region (i.e. the line width of the pattern which is known), location of the center of gravity of the seriate region, location (or number) of the inflection point existing in the seriate region, figuration of the skeleton line of the seriate region.

When a plurality of the seriate regions are obtained, it can be considered that this is cased from the breakage of a pattern.

In Step S63, a reference characteristic quantum of a wiring pattern i, which is determined in advance and is also stored in the memory, is read out. In Step S68, a matching operation is executed by comparing an actually obtained characteristic quantum with the read-out reference characteristic quantum. In Step S72, a defective portion is detected according to the result of the matching operation.

For example, when the actually measured length of the seriate region in the image of the pattern line is shorter than that in the read-out reference characteristic quantum, this is judged as no good, i.e. existence of a breakage of the pattern. When no difference between both lengths exists but both locations in the center of gravity are out of alignment, this is judged as existence of a partly chipped portion.

When the actually obtained entire length of the seriate region is indicated as zero or when the actual obtained characteristic quantum is increased in the entire length, i.e. actual length in the longitudinal direction of the seriate region, and the number of the inflection point than those of the read-out reference characteristic quantum, this is judged as existence of a breakage of a pattern.

Since one of pattern lines is grounded in the present inspection system, the pattern line as an inspecting object can be also grounded when a short-circuit exists between the grounded pattern lines. This is one of the reasons why no actual quantum in the seriate region can be detected.

In Step 74, the actually obtained image of a pattern line and the reference characteristic quantum of the pattern line is displayed with lapping over each other or in parallel. When displayed with lapping over each other, it may be adapted to display with different colors-between the actually obtained image of a pattern line and the image of the reference characteristic quantum, so called the blend display. Additionally, the defective portion which is obtained in Step S72 may be displayed together with the above display.

As described above, according to the control procedure shown in FIG. 31, this inspection system can detect a defective portion by use of the technique of pattern matching to indicate it to users.

In the embodiment described above, the electrode or terminal for inputting an inspection signal may be disposed at any position in the board if the electrode never interfers with the sensor probe board, and has a width as large as that which allows the probe to be contacted. However, it is desirable to use a terminal of the circuit board 200 as the above terminal.

[Effect of the Embodiment]

With the manufacturing method and the sensor board manufactured by this method according to the embodiment described above, the following effects can be obtained.

E-1: By using the semiconductor process, each sensor element may be of micrsscropic size, and it becomes possible to inspect a circuit board having a more microscropic wiring pattern.

E-2: The figuration of the sensor may optionally be set by the mask pattern used in this manufacturing process. In other words, if the wiring pattern of the circuit board as an inspection object optionally has any figuration, an inspection probe having an optimum structure for such a circuit board may be manufactured by making up the mask pattern corresponding to the figuration of the sensor and using the resulting mask pattern. For example, the sensor elements may selectively be formed only at the position above an inspecting work in which a pattern line generating a substantial signal is located.

E-3: When the sensor of the present invention is used as a non-contact sensor, it is calculated that the intensity of received signal would become extremely weak due to the reduced area of the electrode 40 of the sensor. Therefore, a problem on the crosstalk from other cells, i.e. other sensor elements, which is unexpected level in standard IC memory circuits. Since the shield layer is provided between the electrode layer and the lead wire layer in the embodiment described above, the noise may be reduced and thereby the receiving sensitivity may be improved.

E-4: By using a sensor which has the effects E-1, E-2 and E-3, it becomes possible to inspect a defect of the work board as an inspecting object in a microscopic level.

[Modifications]

M-1: In the present invention, more microscopic sensor element, more increased resolution. However this results in increased cost and labor hours for manufacturing the sensor board, and weakened output intensity of the sensor elements. Therefore, it is desirable to provide preamplifiers for each sensor elements. In this case, it may be adapted to use a transistor as the preamplifier and to use the transistor suitable for an active matrix type display for all sensor elements.

M-2: The insulation layer 35 as the most upper layer of each sensor element in the sensor board 20, P described above is preferable to be thinned in order to shorten the distance to the inspecting work to improve the sensor sensitivity.

M-3: In a actual inspecting operation, there exists an air layer and the insulation layer 35 between the electrode 40 and the inspecting work. Thus, the dielectric constant of the insulation layer 35 is desirable to be lowered in order to improve the sensor sensitivity.

M-4: As shown in FIG. 6, the sensor board of the embodiment is formed on the board 30 made of silicon. Because the effect is expected in which the flatness of entire sensor board is improved due to the sensor elements formed on the silicon board. Improving the flatness allows the distance between the work board as an inspecting object and the electrode to be constant, thereby the variance of measurement values between sensor elements can be small. In this point, the bridge pole 41 may be extended downward up to the silicon board 30 (up to the silicon dioxide 31 shown in FIG. 6). Further, when these flatness is unnecessary, the sensor element may be formed on the silicon dioxide board 31.

Figure 32:
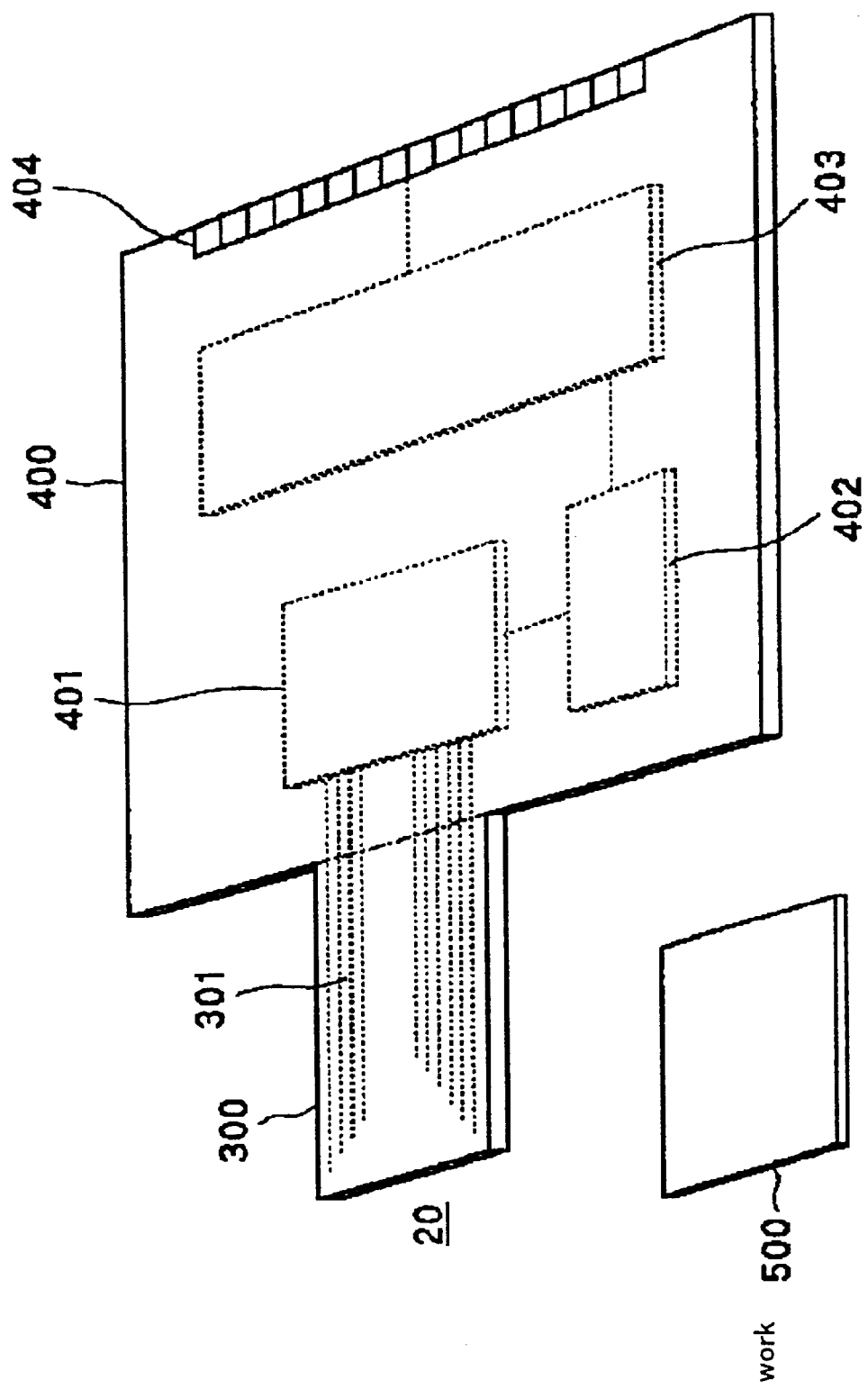
FIG. 32 is a perspective view illustrating a structure according to a modification of a sensor probe of the present invention.

M-5: The sensor board of the embodiment is preferable to be formed in a single board including a signal conditioning circuit. FIG. 32 shows one example in which a sensor portion and a signal conditioning portion are formed on the common silicon (Si) board. The reference numbers 400 and 300 are the same single silicon (Si) board. Electronic circuits 401, 402, 403 are formed on the silicon board 400. A connector 404 is provided at one end of the silicon board 400. These electronic circuits is made up by a hybrid circuit or a monolithic circuit. The reference number 401 indicates a preamplifier (or multiplexer), the reference number 402 indicates an amplifier, and the reference number 403 indicates a filter (for use of signal conditioning). A number of sensor elements 21 as same as that shown in FIG. 6 are formed on the silicon board 300. These forms a sensor probe board 20.

Figure 33:
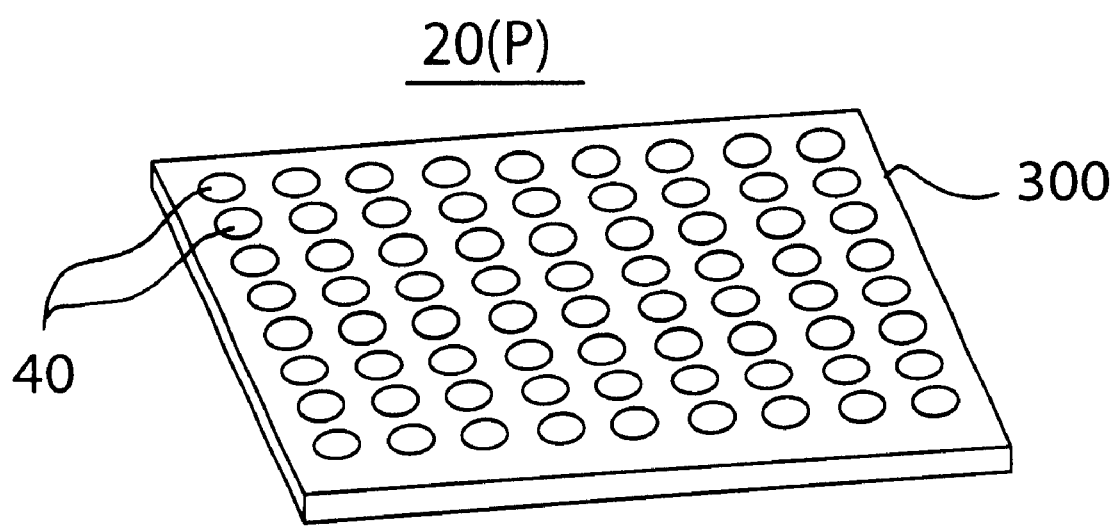
FIG. 33 is a perspective view showing the probe of FIG. 32, viewing the electrodes.

In FIG. 32, an electrode, a bridge pole 41 and the like in the sensor board 20 are formed being grown in the direction directed to a rear face of the drawing sheet. The status where the silicon board 300 is turned over is shown in FIG. 33. As seeing in FIG. 33, it may be found that a plurality of circular shaped electrodes 40 are formed on a surface of the sensor board 20. With reference to FIG. 32, signal lines 301 which transfer signals from each sensor elements are connected to the preamplifier 401 described above. The silicon board 400 shown in FIG. 32 is attached to an inspection unit (not shown) through connectors 404. By means of these integrated sensor board and signal conditioning circuit board, the inspection operation may progress with less noise and enhanced stability. Further, size reduction and improved portability may also be achieved by the integration. For example, this enables the unit to approximate the work board P during inspection operation.

M-6: While the CVD process is applied in the embodiment described above, a film layer may be formed by the vapor deposition process or the sputtering process.

M-7: While the wiring layer is formed of aluminum in the embodiment described above, copper (Cu) or silver (Ag) may alternatively be used for aluminum (Al). Since the present invention does not depend on the sort of material of the wiring layer, it is apparent to the skilled in the art that any suitable materials, such as conductive materials which may be used in parallel with advancing the semiconductor technologies as well as aluminum (Al), copper (Cu) and silver (Ag) can be applied in the manufacturing process of the sensor probe according to the present invention.

M-8: The manufacturing process shown in FIG. 8 to FIG. 19 is simply provided for an example. Therefore, the probe of the present invention may be produced by other suitable processes.

M-9: While SOG is applied as insulation material, other suitable insulation and passivation materials may be used.

[Effect of the present invention]

As described above, according to a manufacturing method of a sensor probe for use in board inspection, an improved sensor probe is shown which has a plurality of microscopic sensors, for use in board inspection by applying the semiconductor process.

In addition, since a sensor probe for use in board inspection, the present invention comprises an electrode layer, a bridge layer and a lead wire layer, and the structure is suitable for formation at microscopic sizes.

What is claimed is:

1. A sensor probe for use in a board inspection, said sensor probe comprising:

an electrode layer, a lead wire layer, a bridge layer, and a base formed of a flat plate composed of either of silicon or silicon oxide, said electrode layer, said lead wire layer, and said bridge layer being laminated on said base, said electrode layer being comprised of a set of sensor electrodes, said lead wire layer being comprised of a set of lead wires for transferring a signal to outside, and said bridge layer coupling between said electrode layer and said lead wire layer, and wherein said lead wire layer includes a plurality of lead wires which are formed on said base and are connected to an outside pad;

said bridge layer includes a plurality of bridge wires which are respectively connected to respective said lead wires of said lead wire layer and are extended in a direction perpendicular to said base; and said set of sensor electrodes respectively extend in the horizontal direction from respective said lead wires and have a predetermined area.

2. The sensor probe for use in a board inspection as defined in the claim 1, wherein said the electrode layer is formed by forming a film from either aluminum or copper.

3. The sensor probe for use in a board inspection as defined in the claim 1, wherein said bridge layer is formed by growing either aluminum or copper.

4. The sensor probe for use in a board inspection as defined in the claim 1, wherein said lead wire layer is formed by forming a film from either aluminum or copper or by growing either aluminum or copper.

5. The sensor probe for use in board inspection as defined in the claim 1, wherein a cross-sectional area of each said bridge wire is set smaller than an area of each of said electrodes, and said sensor probe further comprises an electrical shield layer, wherein said electrical shield layer is provided between said electrode layer and said lead wire layer with making said electrical shield layer not to contact to each said bridge wire, the electrical shield layer being extended in the direction along said flat surface of said base.

6. The sensor probe for use in a board inspection as defined in the claim 1, wherein said sensor probe further comprises a first insulation layer provided between said electrode layer and said lead layer, and wherein each said bridge wire of said bridge layer is formed with penetrating said first insulation layer.

7. The sensor probe for use in a board inspection as defined in the claim 1, wherein said sensor probe further comprises a second insulation layer provided between said electrode layer and said shield layer, and a third insulation layer provided between said shield layer and said lead layer, and wherein said second insulation layer and said third insulation layer are coupled each other in the vicinity of respective said bridge wires to enable each said bridge wire to be assured not to electrically connect to any of said shield layers.

8. The sensor probe for use in a board inspection as defined in the claim 1, wherein each said electrode of said electrode layer is provided horizontally on said flat surface of said circuit board as an inspecting object.

9. The sensor probe for use in a board inspection as defined in the claim 1, wherein each said lead wire of said lead wires is connected to respective pads.

10. The sensor probe for use in a board inspection as defined in the claim 1, wherein said predetermined conductive material is either of aluminum and copper.

11. The sensor probe for use in a board inspection as defined in the claim 1, wherein said sensor probe further comprises a signal conditioning circuit, wherein said signal conditioning circuit is formed in the base.

* * * * *